(12) United States Patent
Kobayashi

(10) Patent No.: US 11,747,409 B2
(45) Date of Patent: Sep. 5, 2023

(54) MAGNETIC SENSOR, POSITION DETECTION APPARATUS AND ELECTRONIC DEVICE

(71) Applicant: TDK Corporation, Tokyo (JP)

(72) Inventor: Takafumi Kobayashi, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 17/552,994

(22) Filed: Dec. 16, 2021

(65) Prior Publication Data
US 2022/0260654 A1  Aug. 18, 2022

(30) Foreign Application Priority Data
Feb. 12, 2021  (JP) .................. 2021-020553

(51) Int. Cl.
*G01R 33/09* (2006.01)
*G01R 33/00* (2006.01)
*G01R 33/421* (2006.01)

(52) U.S. Cl.
CPC ....... *G01R 33/093* (2013.01); *G01R 33/0023* (2013.01); *G01R 33/4215* (2013.01)

(58) Field of Classification Search
CPC combination set(s) only.
See application file for complete search history.

(56) References Cited

U.S. PATENT DOCUMENTS

| 6,221,518 B1 * | 4/2001 | Araki .................. H01F 10/3268 324/252 |
| 2004/0165319 A1 * | 8/2004 | Wan ....................... B82Y 25/00 324/252 |
| 2006/0251928 A1 * | 11/2006 | Quandt .................... G01L 9/007 428/811.1 |
| 2016/0163962 A1 * | 6/2016 | Mather .................... H01L 43/02 257/421 |
| 2017/0212175 A1 * | 7/2017 | Holm .................. G01R 33/0005 |
| 2017/0212189 A1 * | 7/2017 | Holm .................. G01R 33/0005 |

(Continued)

FOREIGN PATENT DOCUMENTS

| JP | 2008-170368 A | 7/2008 |
| JP | 2013-32989 A | 2/2013 |

(Continued)

*Primary Examiner* — Alvaro E Fortich
(74) *Attorney, Agent, or Firm* — POSZ LAW GROUP, PLC

(57) ABSTRACT

A magnetic sensor includes a magnetic field conversion unit that outputs an output magnetic field, a magnetic field detection unit that the output magnetic field can be applied, and a magnetic shield that shields external magnetic fields. The length of the magnetic field conversion unit in the third direction is greater than the length in the second direction. The magnetic shield overlaps the magnetic field conversion unit and the magnetic field detection unit. The magnetic field detection unit includes a Wheatstone bridge circuit in which a first bridge circuit including first and second magnetic field detection units and a second bridge circuit including third and fourth magnetic field detection units are connected in parallel. The first through fourth magnetic field detection units include two magnetoresistive units, and two of the magnetoresistive units have magnetoresistive effect elements that include magnetization fixed layers whose magnetization directions differ from each other.

17 Claims, 24 Drawing Sheets

(56) References Cited

U.S. PATENT DOCUMENTS

2017/0322052 A1 11/2017 Paul et al.
2019/0301894 A1* 10/2019 Uchida .................. G01D 5/145
2020/0064414 A1 2/2020 Uchida
2021/0096194 A1 4/2021 Cai et al.

FOREIGN PATENT DOCUMENTS

| JP | 2018-503803 A | 2/2018 |
| JP | 2019-174196 A | 10/2019 |
| JP | 2020-30155 A | 2/2020 |
| JP | 2021-56170 A | 4/2021 |

* cited by examiner

MAGNETIC SENSOR, POSITION DETECTION APPARATUS AND ELECTRONIC DEVICE

CROSS REFERENCE TO RELATED APPLICATION

This application is based on and claims priority to Japanese Patent Application No. 2021-020553 filed on Feb. 12, 2021, the disclosure of which is incorporated herein by reference.

TECHNICAL FIELD

The present invention relates to a magnetic sensor, position detection apparatus and electronic device.

BACKGROUND

In recent years, a physical quantity detection device (position detection device) for detecting a physical quantity (for example, a position or a movement amount (change amount) due to rotational movement or linear movement of a moving body) has been used in various applications. As this physical quantity detection device, one provided with a magnetic sensor capable of detecting a change in an external magnetic field and a magnetic field generating unit (for example, a magnet) capable of changing a position relative to the magnetic sensor has been known, and a sensor signal corresponding to change in the external magnetic field is output from the magnetic sensor.

As the magnetic sensor, one has been known in which a magnetic sensor element that detects a magnetic field to be detected is provided on a substrate, and as such a magnetic sensor element, a magnetoresistive effect element (GMR element, TMR element, or the like) in which resistance changes in accordance with changes in an external magnetic field, or the like, is used.

The above-described magnetoresistive effect element includes a laminated structure having at least a free layer whose magnetization direction can be changed in accordance with an external magnetic field, a magnetization fixed layer whose magnetization direction is fixed, and a nonmagnetic layer interposed between the free layer and the magnetization fixed layer. In a magnetoresistive effect element having such a structure, the resistance value of the magnetoresistive effect element is determined by the angle between the magnetization direction of the free layer and the magnetization direction of the magnetization fixed layer. Furthermore, by having the magnetization direction of the free layer change in accordance with the external magnetic field and having the angle of the magnetization directions of the free layer and the magnetization fixed layer change accordingly, the resistance value of the magnetoresistive effect element changes. Due to this change in resistance value, a sensor signal corresponding to the change in the external magnetic field is output.

The magnetoresistive effect element provided on the substrate is often configured to have sensitivity to a magnetic field in a direction parallel to the surface of the substrate.

On the other hand, in the magnetic sensor there is also a requirement that a magnetic field in a direction perpendicular to the surface of the substrate be detected by the magnetoresistive effect element provided on the substrate (see Patent Literature 1). The magnetic sensor can be used to detect the position of a magnet. In this magnetic sensor, a soft magnetic material is provided in order to apply on the magnetoresistive effect element a magnetic field component in a direction orthogonal to the substrate surface, of the magnetic field components generated by the magnet. This soft magnetic material converts the vertical magnetic field component generated by the magnet into a magnetic field component in a direction parallel to the substrate surface to which the magnetoresistive effect element has sensitivity. This converted magnetic field component is applied on the magnetoresistive effect element.

PATENT LITERATURE

JP Laid-Open Patent Application No. 2015-129697

In the magnetic sensor, the components of the magnetic field generated by the magnet include the above-described vertical magnetic field component and a horizontal magnetic field component in a direction parallel to the substrate surface. If this horizontal magnetic field component is applied on the magnetoresistive effect element sensor, there is a concern that the detection accuracy by the magnetic sensor may be lowered. In order to resolve this problem, the idea of providing a magnetic shield for shielding the horizontal magnetic field component has been considered.

However, the magnetic shield cannot completely shield the horizontal magnetic field component, and because a part of the horizontal magnetic field component passes through, the horizontal magnetic field component that passes through will affect the signal output from the magnetic sensor. Specifically, when a horizontal magnetic field component that passes through the magnetic shield is applied on the magnetic sensor, there is a concern that offsetting of the output from the magnetic sensor or fluctuation in the midpoint potential may occur, which may reduce the detection accuracy of the magnetic sensor.

In consideration of the foregoing, it is an object of the present invention to provide a magnetic sensor, a position detection apparatus and an electronic device that suppress fluctuations in the midpoint potential and improve detection accuracy.

SUMMARY

To achieve the above object, the present invention provides a magnetic sensor comprising a magnetic field conversion unit that receives an input magnetic field input along a first direction and outputs an output magnetic field along a second direction orthogonal to the first direction, a magnetic field detection unit provided at a position at which the output magnetic field can be applied, and a magnetic shield that shields external magnetic fields along the second direction; wherein the magnetic field conversion unit has a shape in which the length in a third direction orthogonal to both the first direction and the second direction is longer than the length in the second direction, when viewed along the first direction; the magnetic shield is provided at a position overlapping the magnetic field conversion unit and the magnetic field detection unit, when viewed along the first direction; the magnetic field detection unit includes a Wheatstone bridge circuit in which a first bridge circuit, which includes a first magnetic field detection unit and a second magnetic field detection unit, and a second bridge circuit, which includes a third magnetic field detection unit and fourth magnetic field detection unit, are connected in parallel; the first through fourth magnetic field detection units each include a first magnetoresistive unit and a second magnetoresistive unit; and the first magnetoresistive unit and the second magnetoresistive unit included in each of the first through fourth magnetic field detection units have magnetoresistive effect elements that include magnetization fixed layers, the magnetization directions of which differ from each other.

In the above-described magnetic sensor, the first magnetoresistive unit and the second magnetoresistive unit included in each of the first through fourth magnetic field detection units may be connected in parallel or may be connected in series.

In the above-described magnetic sensor, the Wheatstone bridge circuit may include a power supply port, a ground port, a first output port and a second output port; the first magnetic field detection unit may be provided between the power supply port and the first output port; the second magnetic field detection unit may be provided between the first output port and the ground port; the third magnetic field detection unit may be provided between the power supply port and the second output port; the fourth magnetic field detection unit may be provided between the second output port and the ground port; and the first magnetoresistive unit and the second magnetoresistive unit included in two magnetic field detection units of the first magnetic detection unit, the second magnetic field detection unit, the third magnetic field detection unit and the fourth magnetic field detection unit may be connected in parallel, and the first magnetoresistive unit and the second magnetoresistive unit included in the other two magnetic field detection units may be connected in series.

The first magnetoresistive unit and the second magnetoresistive unit included in each of the first through fourth magnetic field detection units may each include a plurality of magnetoresistive effect elements, and the number of magnetoresistive effect elements included in the first magnetoresistive unit and the number of magnetoresistive effect elements included in the second magnetoresistive unit may be the same, and the number of magnetoresistive effect elements included in the first magnetoresistive unit may be larger than the number of magnetoresistive effect elements included in the second magnetoresistive unit. The ratio of the number of magnetoresistive effect elements included in the first magnetoresistive unit to the number of magnetoresistive effect elements included in the second magnetoresistive unit can be 2:1~4:1.

The magnetization direction of the magnetization fixed layer of the magnetoresistive effect elements included in the first magnetoresistive unit and the magnetization direction of the magnetization fixed layer of the magnetoresistive effect elements included in the second magnetoresistive unit may be antiparallel to each other and are a direction along the second direction. The magnetic shield may have a shape in which the maximum length in the third direction is longer than the maximum length in the second direction, when viewed along the first direction. A plurality of the magnetic conversion units may be in parallel along the second direction. The magnetic shield may include a first magnetic shield and a second magnetic shield, and the magnetic field conversion unit and the magnetic field detection unit may be provided between the first magnetic shield and the second magnetic shield in the first direction. The magnetic shield may be positioned to one side or the other side of the magnetic field conversion unit and the magnetic field detection unit along the first direction. The first magnetoresistive unit and the second magnetoresistive unit included in each of the first through fourth magnetic field detection units may have an axis that passes through the center of the magnetic field conversion unit in the lateral direction and may be provided at a position of linear symmetry centered on the axis along the longitudinal direction of the magnetic field conversion unit. The magnetoresistive effect elements can be TMR elements or GMR elements.

The present invention provides a position detection apparatus comprising the above-described magnetic sensor, a magnetic field generation unit that generates the input magnetic field, and a substrate on which the magnetic sensor is provided, wherein the magnetic field generation unit is supported on the substrate to be movable along at least one direction of the first direction and the third direction relative to the substrate.

The present invention provides an electronic device comprising the above-described position detection apparatus.

With the present invention, it is possible to provide a magnetic sensor, a position detection apparatus and an electronic device that suppress fluctuations in the midpoint potential and improve detection accuracy.

DESCRIPTION

Below, an embodiment of the present invention will be described with reference to the drawings.

In a magnetic sensor device according to the present embodiment, the "X direction, Y direction and Z direction" are specified in some drawings as necessary. Here, the X direction and the Y direction are directions orthogonal to each other in a plane substantially parallel to a first surface 104A and a second surface 104B of a substrate 104 in the present embodiment (see FIG. 2), and the Z direction is the thickness direction of the substrate 104 (the direction orthogonal to the first surface 104A and the second surface 104B of the substrate 104).

Figure 1:
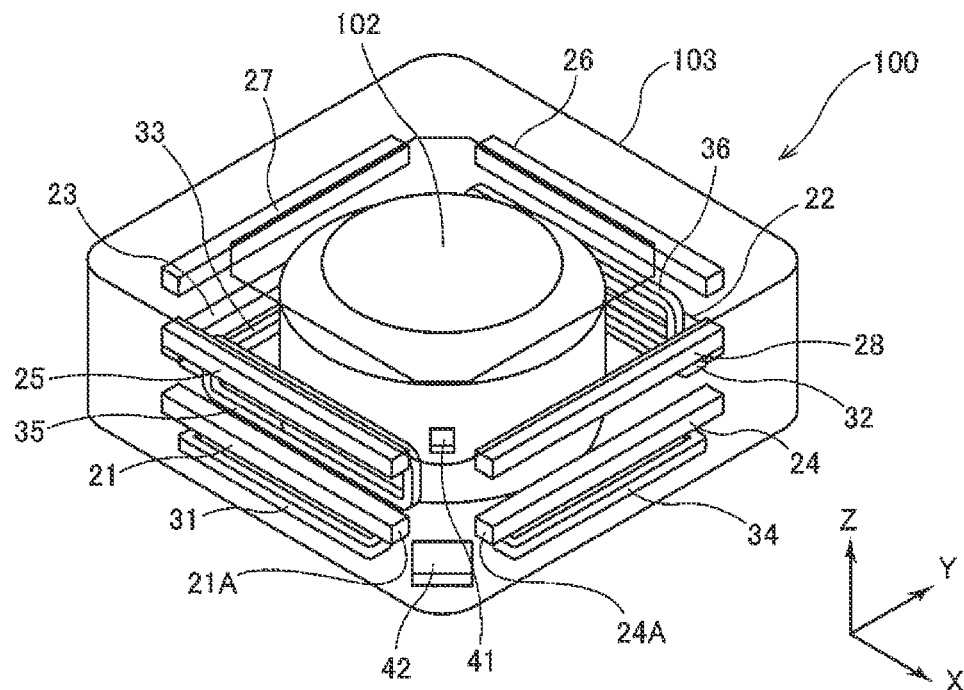
FIG. 1 is a perspective view showing a schematic configuration of a camera module including a magnetic sensor device according to an embodiment of the present invention.
Figure 2:
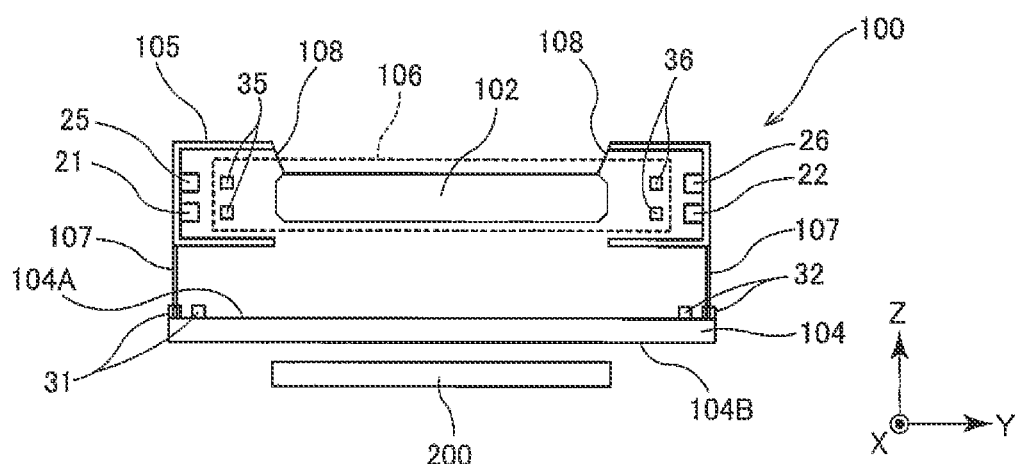
FIG. 2 is a schematic view schematically showing the internal structure of the camera module shown in FIG. 1.

A camera module 100 in the present embodiment includes, for example, a portion of a camera for a smartphone provided with an optical image stabilization mechanism and an autofocus mechanism and is used in combination with an image sensor 200 using CMOS or the like (see FIG. 1 and FIG. 2).

The camera module 100 is provided with a drive device, a lens 102, a housing 103, and the substrate 104 (see FIG. 1 and FIG. 2). The drive device has a function of moving the lens 102. The drive device includes a magnetic sensor device according to the present embodiment. The housing 103 has a function of protecting the drive device. The substrate 104 has a first surface 104A and a second surface 104E facing such.

The lens 102 is arranged above the first surface 104A of the substrate 104 in an attitude in which the optical axis direction is parallel to the Z direction. The substrate 104 has an aperture (omitted from drawings) that passes light that has passed through the lens 102. The camera module 100 is aligned with respect to the image sensor 200 so that light that has passed through the apertures of the lens 102 and the substrate 104 is incident on the image sensor 200.

The drive device includes a first holding member 105, a second holding member 106, a plurality of first wires 107 and a plurality of second wires 108 (see FIG. 2). The second holding member 106 holds the lens 102, and can have, for example, a cylindrical shape into which the lens 102 can be mounted.

The second holding member 106 is provided to be repositionable in one direction with respect to the first holding member 105, specifically, in a direction parallel to the optical axis direction (Z direction) of the lens 102. In the present embodiment, the first holding member 105 has a box-like shape capable of accommodating the lens 102 and the second holding member 106 inside the first holding member 105. The plurality of second wires 108 connects the first holding member 105 and the second holding member 106 and supports the second holding member 106 so that the second holding member 106 can move relative to the first holding member 105 in the Z direction.

The first holding member 105 is provided above the first surface 104A of the substrate 104 to be repositionable in at least one direction of the X direction and the Y direction with respect to the substrate 104. The plurality of first wires 107 connects the substrate 104 and the first holding member 105 and supports the first holding member 105 so that the first holding member 105 can move relative to the substrate 104 along at least one direction of the X direction and the Y direction. When the relative position of the first holding member 105 with respect to the substrate 104 changes, the relative position of the second holding member 106 with respect to the substrate 104 also changes.

Figure 3:
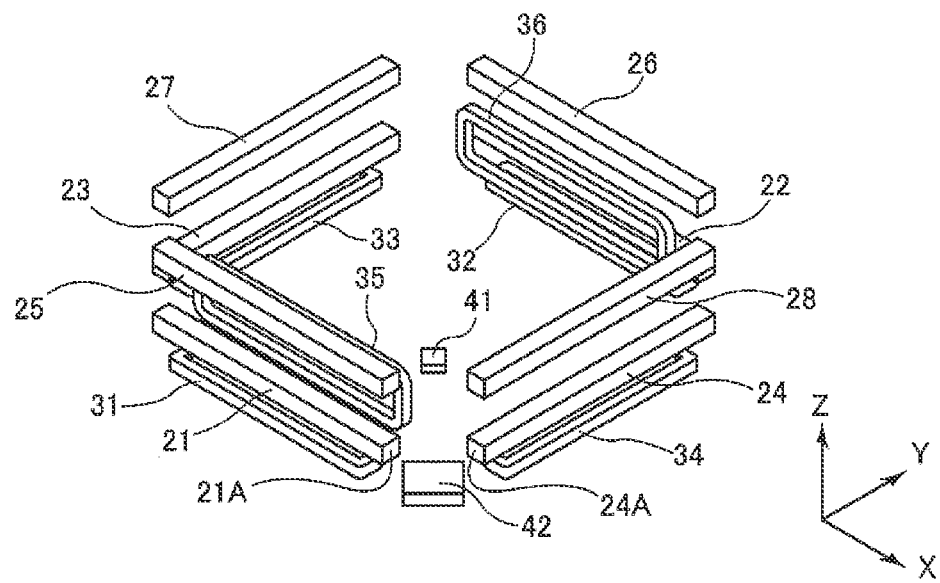
FIG. 3 is a perspective view showing the drive device of the camera module shown in FIG. 1.

The drive device includes a plurality of magnets (first to eighth magnets 21~28) and a plurality of coils (first to sixth coils 31~36) (see FIG. 1 and FIG. 3). The first magnet 21 and the second magnet 22 are arranged so that the lens 102 is interposed therebetween along the Y direction. The third magnet 23 and the fourth magnet 24 are arranged so that the lens 102 is interposed therebetween along the X direction. The fifth to eighth magnets 25~28 are arranged above (in the +Z direction) the first to fourth magnets 21~24, respectively. The first to eighth magnets 21~28 are fixed to the first holding member 105.

Figure 6:
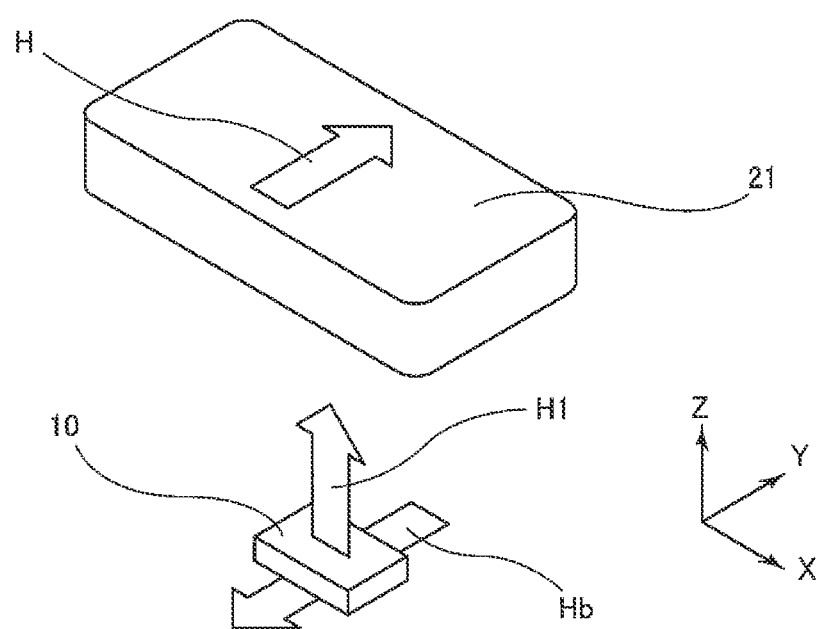
FIG. 6 is a perspective showing a main part of the magnetic sensor device according to an embodiment of the present invention.
Figure 7:
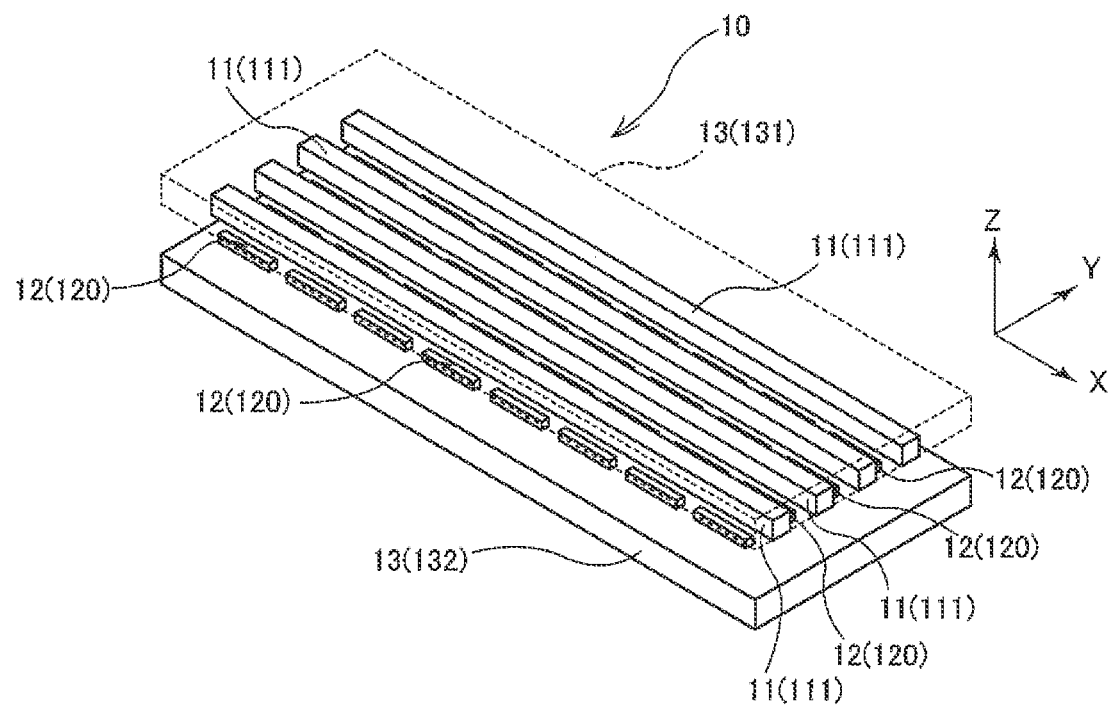
FIG. 7 is a perspective showing a schematic configuration of the magnetic sensor according to an embodiment of the present invention.

The first magnet 21, the second magnet 22, the fifth magnet 25 and the sixth magnet 26 each have a rectangular parallelepiped shape with the longitudinal direction oriented in the X direction. The third magnet 23, the fourth magnet 24, the seventh magnet 27 and the eighth magnet 28 each have a rectangular parallelepiped shape with the longitudinal direction oriented in the Y direction (see FIG. 1 and FIG. 3). The magnetization direction H of the first magnet 21 (see FIG. 6) and the magnetization direction of the sixth magnet 26 are the +Y direction, and the magnetization directions of the second magnet 22 and the fifth magnet 25 are the −Y direction. The magnetization directions of the third magnet 23 and the eighth magnet 28 are in the +X direction, and the magnetization directions of the fourth magnet 24 and the seventh magnet 27 are in the −X direction.

The first coil 31 is arranged between the first magnet 21 and the substrate 104, and the second coil 32 is arranged between the second magnet 22 and the substrate 104 (see FIG. 2). The third coil 33 is arranged between the third magnet 23 and the substrate 104, and the fourth coil 34 is arranged between the fourth magnet 24 and the substrate 104. The fifth coil 35 is arranged between the first magnet 21 and the fifth magnet 25 and the lens 102, and the sixth coil 36 is arranged between the second magnet 22 and the sixth magnet 26 and the lens 102. The first to fourth coils 31~34 are fixed to the first surface 104A of the substrate 104, and the fifth coil 35 and the sixth coil 36 are fixed to the second holding member 106.

A magnetic field mainly generated from the first magnet 21 is applied on the first coil 31, a magnetic field mainly generated from the second magnet 22 is applied on the second coil 32, and a magnetic field mainly generated from the third magnet 23 is applied on the third coil 33, and a magnetic field mainly generated from the fourth magnet 24 is applied on the fourth coil 34.

Figure 4:
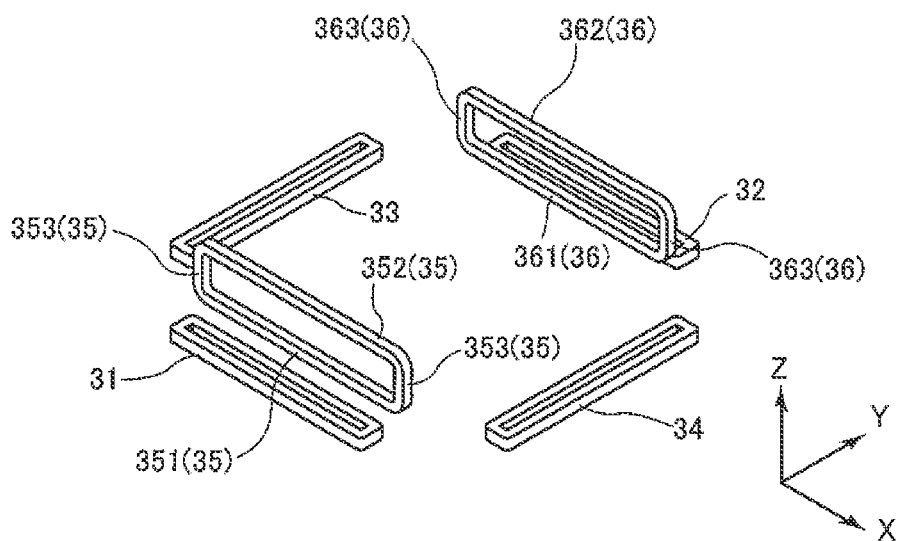
FIG. 4 is a perspective view showing a plurality of coils of the drive device shown in FIG. 3.

The fifth coil 35 includes a first conductor portion 351 extending in the X direction along the first magnet 21, a second conductor portion 352 extending in the X direction along the fifth magnet 25, and two third conductor portions 353 that connect one end each and the other end each of the first conductor portion 351 and the second conductor portion 352 in the Z direction (see FIG. 4). The sixth coil 36 includes a first conductor portion 361 extending in the X direction along the second magnet 22, a second conductor portion 362 extending in the X direction along the sixth magnet 26, and two third conductor portions 363 that connect one end each and the other end each of the first conductor portion 361 and the second conductor portion 362 in the Z direction (see FIG. 4).

A component in the +Y direction of the magnetic field mainly generated from the first magnet 21 is applied on the first conductor portion 351 of the fifth coil 35. A component in the −Y direction of the magnetic field mainly generated from the fifth magnet 25 is applied on the second conductor portion 352 of the fifth coil. A component in the −Y direction of the magnetic field mainly generated from the second magnet 22 is applied on the first conductor portion 361 of the sixth coil 36. A component in the +Y direction of the magnetic field mainly generated from the sixth magnet 26 is applied on the second conductor portion 362 of the sixth coil 36.

Figure 5A:
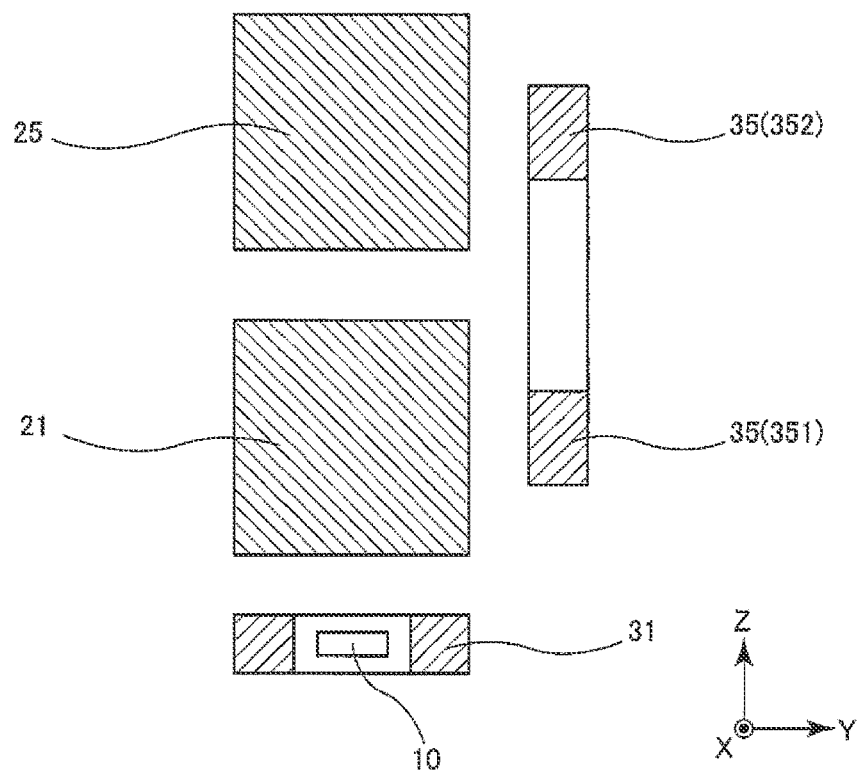
FIG. 5A is a cross-sectional view showing a main part of the drive device shown in FIG. 3.
Figure 5B:
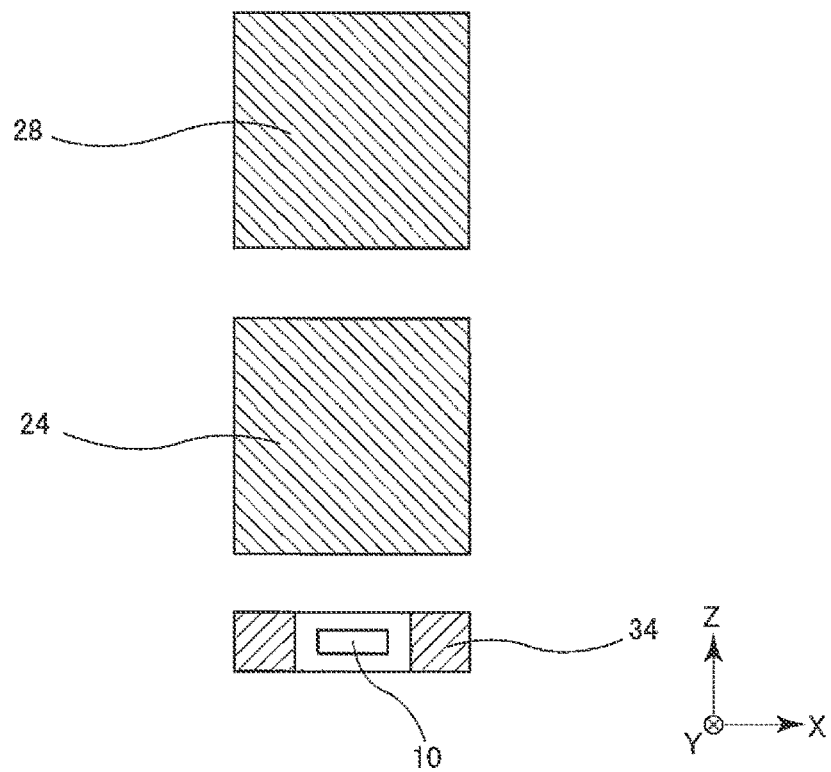
FIG. 5B is a cross-sectional view showing a main part of the drive device shown in FIG. 3.

The drive device is provided with a magnetic sensor 10 fixed to the substrate 104 inside either the first coil 31 or the second coil 32, and a magnetic sensor 10 fixed to the substrate 104 inside either the third coil 33 or the fourth coil 34. In this embodiment, the two magnetic sensors 10 are arranged inside the first coil 31 and inside the fourth coil 34, respectively (see FIG. 5A and FIG. 5B). The two magnetic sensors 10 output sensor signals for changing the position of the lens 102 in order to reduce the influence of camera shakes.

The magnetic sensor 10 arranged inside the first coil 31 detects the magnetic field generated from the first magnet 21 and outputs a sensor signal corresponding to the position of the first magnet 21. The magnetic sensor 10 arranged inside the fourth coil 34 detects the magnetic field generated from the fourth magnet 24 and outputs a sensor signal corresponding to the position of the fourth magnet 24. The configuration of each magnetic sensor 10 will be described later.

The drive device is provided with a magnet 41 and a magnetic sensor 42 (see FIG. 1 and FIG. 3). The magnetic sensor 42 is used to detect the position of the lens 102 during automatic focusing. The magnetic sensor 42 is fixed to the first surface 104A of the substrate 104 in the vicinity of the end surface 21A of the first magnet 21 and the end surface 24A of the fourth magnet 24. The magnetic sensor 42 can include, for example, a Hall element, or a magnetoresistive effect element such as an AMR element, a GMR element, or a TMR element.

The magnet 41 is fixed to the second holding member 106 above the magnetic sensor 42 and has a rectangular parallelepiped shape. When the relative position of the second holding member 106 with respect to the first holding member 105 changes in the direction parallel to the Z direction, the relative position of the magnet 41 with respect to the first holding member 105 also changes in the direction parallel to the Z direction.

Here, the operation of the drive device will be described.

The drive device constitutes a part of the optical image stabilization mechanism and the autofocus mechanism. The drive device, the optical image stabilization mechanism and the autofocus mechanism are controlled by an external control unit (omitted from the drawings) of the camera module 100.

The optical image stabilization mechanism is configured so that camera shakes can be detected by, for example, an external gyro sensor of the camera module 100. When the optical image stabilization mechanism detects a camera shake, the control unit controls the drive device so that the relative position of the lens 102 with respect to the substrate 104 changes according to the mode of camera shake. As a result, the absolute position of the lens 102 can be stabilized and the influence of camera shakes can be reduced. The relative position of the lens 102 with respect to the substrate 104 changes in the X direction and the Y direction depending on the mode of camera shake.

The autofocus mechanism is configured so that, for example, an image sensor 200 or an autofocus sensor can detect a state in which the subject is in focus. The control unit changes the relative position of the lens 102 with respect to the substrate 104 in the Z direction by means of the driving device so that the subject is in focus. Through this, it is possible to automatically focus on the subject.

The operation of the drive device related to the optical image stabilization mechanism will be described.

When a current is applied on the first coil 31 and the second coil 32 by the control unit, the first holding member 105 to which the first magnet 21 and the second magnet 22 are fixed moves in the Y direction due to interaction between the magnetic fields generated from the first magnet 21 and the second magnet 22 and the magnetic fields generated from the first coil 31 and the second coil 32. As a result, the lens 102 also moves in the Y direction. Furthermore, when a current is applied on the third coil 33 and the fourth coil 34 by the control unit, the first holding member 105 to which the third magnet 23 and the fourth magnet 24 are fixed moves in the X direction due to interaction the magnetic fields generated from the third magnet 23 and the fourth magnet 24 and the magnetic fields generated from the third coil 33 and the fourth coil 34 are generated. As a result, the lens 102 also moves in the X direction. The control unit detects the position of the lens 102 based on signals corresponding to the positions of the first magnet 21 and the fourth magnet 24 detected by the two magnetic sensors 10.

The operation of the drive device related to the autofocus mechanism will be described.

When moving the relative position of the lens 102 with respect to the substrate 104 in the Z direction, the control unit applies a current on the fifth coil 35 so that current flows in the +X direction in the first conductor portion 351 and so that current flows in the −X direction in the second conductor portion 352, and applies a current on the sixth coil 36 so that a current flows in the −X direction in the first conductor portion 361 and a current flows in the +X direction in the second conductor portion 362. A Lorentz force in the Z direction acts on the first conductor portion 351 and the second conductor portion 352 of the fifth coil 35 and the first conductor portion 361 and the second conductor portion 362 of the coil 36 due to magnetic fields generated by these currents and the first magnet 21, the second magnet 22, the fifth magnet 25 and the sixth magnet 26. Through this, the second holding member 106 to which the fifth coil 35 and the sixth coil 36 are fixed moves in the Z direction. As a result, the lens 102 also moves in the Z direction. When the relative position of the lens 102 with respect to the substrate 104 is moved in the −Z direction, the control unit can apply a current on the fifth coil 35 and the sixth coil 36 in the opposite directions to the above-described case in which the lens 102 is moved in the Z direction.

When the relative position of the lens 102 with respect to the substrate 104 changes in the Z direction, the relative position of the magnet 41 with respect to the magnetic sensor 42 also changes in the Z direction. The magnetic sensor 42 detects at least the magnetic field generated by the magnet 41 and generates a signal corresponding to the position of the magnet 41. The control unit detects the position of the lens 102 based on the signal generated by the magnetic sensor 42.

Next, a schematic configuration of the magnetic sensor device according to the present embodiment will be described.

The magnetic sensor device in the present embodiment is provided with a magnetic sensor 10 arranged inside the first coil 31, and a first magnet 21 as a magnetic field generating unit. Furthermore, the magnetic sensor device in the present embodiment is provided with a magnetic sensor 10 arranged inside the second coil 32, and a second magnet 22 as a magnetic field generating unit. Hereinafter, a magnetic sensor device provided with the first magnet 21 and the magnetic sensor 10 arranged inside the first coil 31 will be described as an example, but needless to say the following description also applies to a magnetic sensor device provided with the second magnet 22 and the magnetic sensor 10 arranged inside the second coil 32.

In the magnetic sensor device, the magnetic sensor 10 and the first magnet 21 are configured so that a partial magnetic field, which is a part of the magnetic field generated by the first magnet 21, can be applied on the magnetic sensor 10. The partial magnetic field generated from the first magnet 21 includes, for example, a first magnetic field component H1 parallel to the Z direction as a first direction (see FIG. 6) and a magnetic field component parallel to the Y direction as a second direction. In the present embodiment, the magnetization direction H of the first magnet 21 is parallel to the Y direction, and consequently, as described below, a part of the magnetic field component parallel to the Y direction included in the partial magnetic field generated from the first magnet 21 can be applied on the magnetic sensor 10 as a bias magnetic field component Hb (see FIG. 6).

As described above, the magnetic sensor 10 is fixed to the substrate 104, and the first magnet 21 is fixed to the first holding member 105. When the position of the first holding member 105 with respect to the substrate 104 changes in the Y direction, the relative position of the first magnet 21 with respect to the magnetic sensor 10 also changes in the Y direction. The output from the magnetic sensor 10 corresponds to the relative position of the first magnet 21 with respect to the magnetic sensor 10 in the Y direction.

The magnetic sensor 10 and the first magnet 21 are configured so that when the relative positions thereof change in the Y direction, the first magnetic field component H1 changes. In the present embodiment, when the first holding member 105 moves in the Y direction and the relative positions of the magnetic sensor 10 and the first magnet 21 change, the first magnetic field component H1 changes.

The magnetic sensor 10 of the present embodiment is provided with a magnetic field conversion unit 11 into which the magnetic field component in the Z direction generated from the first magnet 21 (first magnetic field component H1) is input as an input magnetic field and which converts the first magnetic field component H1 into a magnetic field component in the Y direction (second magnetic field component H2) and outputs such, a magnetic field detection unit 12 provided at a position where the second magnetic field component H2 as an output magnetic field output from the magnetic field conversion unit 11 can be applied, and a magnetic shield 13 for shielding the magnetic field component in the Y direction included in the partial magnetic field generated from the first magnet 21 from being applied on the magnetic field detection unit 12 as an external magnetic field (see FIGS. 7~10).

The magnetic field conversion unit 11 includes a plurality of yokes 111 composed of a soft magnetic material. In the present embodiment, an embodiment in which the magnetic field conversion unit 11 includes a plurality of yokes 111 is given as an example, but the present invention is not limited to this, and the magnetic field conversion unit 11 may include one yoke 111. Each of the plurality of yokes 111 has a shape in which the length in the X direction as the third direction is longer than the length in the Y direction and has a rectangular shape when viewed along the Z direction, for example. The plurality of yokes 111 may be provided so that the longitudinal directions of the yokes 111 are parallel to the X direction when viewed along the Z direction, and or may be provided to be arranged along the Y direction. In the present embodiment, the shapes, the lengths in the longitudinal direction and the lengths in the lateral direction of the plurality of yokes 111 are the same as each other, but at least one of these may be different. Furthermore, although each yoke 111 is continuous in the X direction, each may be divided into a plurality (for example, two) in the X direction. The rectangular shape of each yoke 111 when viewed along the Z direction is an example and is intended to be illustrative and not limiting. For example, the shape of each yoke 111 when viewed along the Z direction may be a quadrilateral having four corners of 89~91°, or a rectangle in which the four corners are rounded.

The magnetic field detection unit 12 outputs a signal corresponding to the change in the first magnetic field component H1 by having applied thereon the second magnetic field component H2 that is the first magnetic field component H1 as an input magnetic field that has been converted by the magnetic field conversion unit 1 (yoke 111) and output (see FIGS. 15A~15D).

The magnetic field detection unit 12 includes a first magnetic field detection unit R1, a second magnetic field detection unit R2, a third magnetic field detection unit R3, and a fourth magnetic field detection unit R4. The first magnetic field detection unit R1 the second magnetic field detection unit R2, the third magnetic field detection unit R3, and the fourth magnetic field detection unit R4 include first magnetoresistive units R11~R41 and second magnetoresistive units R12~R42, respectively. Each of the first magnetoresistive units R11~R41 and the second magnetoresistive units R12~R42 may include at least one magnetoresistive effect element 120, or may include an element sequence in which a plurality of magnetoresistive effect elements 120 are connected in series. In the example shown in FIGS. 8A~8D, each of the first magnetoresistive units R11~R41 and second magnetoresistive units R12~R42 includes an element sequence formed by connecting eight magnetoresistive effect elements 120 in series. In the present embodiment, the number of magnetoresistive effect elements 120 included in the first magnetoresistive units R11~R41 and the number of magnetoresistive effect elements 120 included in the second magnetoresistive units R12~R42 are the same (see FIGS. 8A~8D) but this is intended to be illustrative and not limiting. The number of magnetoresistive effect elements 120 included in the first magnetoresistive units R11~R41 may be different from the number of magnetoresistive effect elements 120 included in the second magnetoresistive units R12~R42. In such a case, the ratio (numerical ratio) between the number of magnetoresistive effect elements 120 included in the first magnetoresistive units R11~R41 and the number of magnetoresistive effect elements 120 included in the second magnetoresistive units R12~R42 is, for example, 2:1~10:1 or 1 2~1:10, and can be about 2:1~4.1 or 1:2 to 1:4. When the number of magnetoresistive effect elements 120 included in the first magnetoresistive units R11~R41 and the number of magnetoresistive effect elements 120 included in the second magnetoresistive units R12~R42 are the same, a stable output can be obtained from the magnetic sensor device even if a bias magnetic field Hb in the +Y direction is applied on the magnetic sensor 10 or if a bias magnetic field Hb in the −Y direction is applied. On the other hand, when the numbers differ, the sensitivity of the magnetic sensor device decreases depending on the direction of the bias magnetic field Hb applied on the magnetic sensor 10, but when the numerical ratio is within the above range, the sensitivity of the magnetic sensor device can be improved more than in the case of the numerical ratio being 1:1 (the same), by applying only a bias magnetic field Hb in one direction (for example, the +Y direction or the −Y direction) on the magnetic sensor 10.

The magnetic field detection unit 12 may include a first magnetoresistive unit and a second magnetoresistive unit connected in series, or may include a first magnetoresistive unit and a second magnetoresistive unit connected in parallel. For example, the first magnetic field detection unit R1, the second magnetic field detection unit R2, the third magnetic field detection unit R3, and the fourth magnetic field detection unit R4 may each include the first magnetoresistive units R11~R41 and the second magnetoresistive units R12~R42 connected in series (see FIG. 8A and FIG. 13A), or may include the first magnetoresistive units R11~R41 and the second magnetoresistive units R12~R42 connected in parallel (see FIG. 8B and FIG. 13B).

Furthermore, the magnetic field detection unit 12 may include a first magnetoresistive unit and a second magnetoresistive unit connected in series, and a first magnetoresistive unit and a second magnetoresistive unit connected in parallel. Specifically, each of two magnetic field detection units of the first magnetic field detection unit R1, the second magnetic field detection unit R2, the third magnetic field detection unit R3, and the fourth magnetic field detection unit R4 may include first magnetoresistive units and second magnetoresistive units connected in series, and each of the other two magnetic field detection units may include first magnetoresistive units and second magnetoresistive units connected in parallel. For example, the first magnetic field detection unit R1 and the third magnetic field detection unit R3 may respectively include the first magnetoresistive units R11 and R31 and the second magnetoresistive units R12 and R32 connected in series, and the second magnetic field detection unit R2 and the fourth magnetic field detection unit R4 may respectively include the first magnetoresistive units R21 and R41 and the second magnetoresistive units R22 and R42 connected in parallel (see FIG. 8C and FIG. 13C). Furthermore, the first magnetic field detection unit R1 and the second magnetic field detection unit R2 may respectively include the first magnetoresistive units R11 and R21 and the second magnetoresistive units R12 and R22 connected in parallel, and the third magnetic field detection unit R3 and the fourth magnetic field detection unit R4 may respectively include the first magnetoresistive units R31 and R41 and the second magnetoresistive units R32 and R42 connected in series (see FIG. 8D and FIG. 13D). Although not shown in the drawings, the first magnetic field detection unit R1 and the third magnetic field detection unit R3 may respectively include the first magnetoresistive units R11 and R31 and the second magnetoresistive units R12 and R32 connected in parallel, and the second magnetic field detection unit R2 and the fourth magnetic field detection unit R4 may respectively include the first magnetoresistive units R21 and R41 and the second magnetoresistive units R22 and R42 connected in series, or the first magnetic field detection unit R1 and the second magnetic field detection unit R2 may respectively include the first magnetoresistive units R11 and R21 and the second magnetoresistive units R12 and R22 connected in series, and the third magnetic field detection unit R3 and the fourth magnetic field detection unit R4 may respectively include the first magnetoresistive units R31 and R41 and the second magnetoresistive units R32 and R42 connected in parallel.

Figure 11:
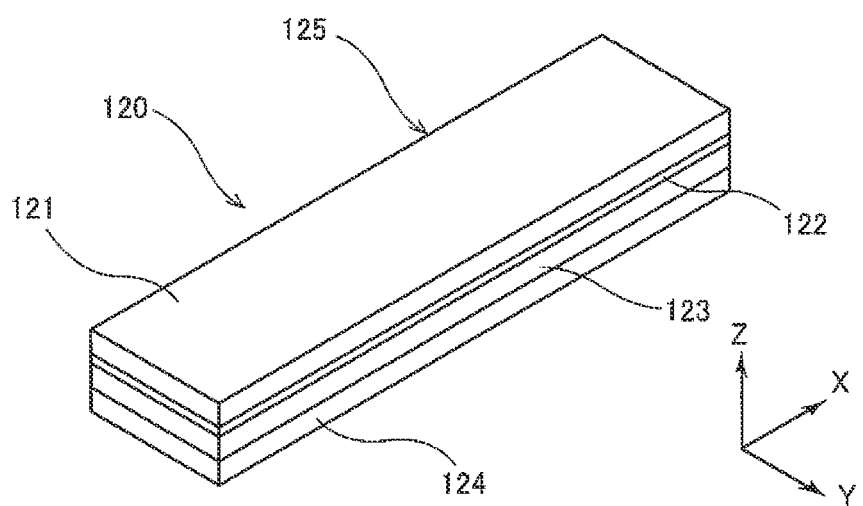
FIG. 11 is a perspective view showing a schematic configuration of a magnetoresistive effect element according to an embodiment of the present invention.

As the magnetoresistive effect element 120 in this embodiment, for example, an MR element such as a TMR element or a GMR element can be used. The magnetoresistive effect element 120 has an MR laminated body 125 that includes an antiferromagnetic layer 124, a magnetization fixed layer 123, a nonmagnetic layer 122 and a free layer 121, laminated in this order (see FIG. 11). The antiferromagnetic layer 124 is made of an antiferromagnetic material and plays the role of fixing the direction of magnetization of the magnetization fixed layer 123 by exchange coupling with the magnetization fixed layer 123. Furthermore, the antiferromagnetic layer 124 may be omitted by making the magnetization fixed layer 123 have a laminated ferromagnetic structure of a ferromagnetic layer 1 a non-magnetic intermediate layer 1 a ferromagnetic layer, with both ferromagnetic layers antiferromagnetically coupled, to form a so-called self-pinned fixed layer (Synthetic Ferri Pinned layer, of SFP layer).

The magnetization direction of the magnetization fixed layer 123 of the magnetoresistive effect element 120 is along the Y direction, and the magnetization direction of the magnetization fixed layer 123 of the magnetoresistive effect element 120 included in the first magnetoresistive units R11~R41 and the magnetization direction of the magnetization fixed layer 123 of the magnetoresistive effect element 120 included in the second magnetoresistive units R12~R42 are antiparallel to each other. For example, the magnetization direction of the magnetization fixed layer 123 of the magnetoresistive effect element 120 included in the first magnetoresistive units R11~R41 can be the +Y direction, and the magnetization direction of the magnetization fixed layer 123 of the magnetoresistive effect element 120 included in the second magnetoresistive units R12~R42 can be the −Y direction.

In a TMR element, the nonmagnetic layer 122 is a tunnel barrier layer. In a GMR element, the nonmagnetic layer 122 is a nonmagnetic conductive layer. In the TMR element and GMR element, the resistance value changes in accordance with the angle formed by the magnetization direction of the free layer 121 with respect to the magnetization direction of the magnetization fixed layer 123, and the resistance value becomes a minimum when this angle is 0° (the magnetization directions are parallel to each other) and the resistance value becomes a maximum when this angle is 180° (the magnetization directions are antiparallel to each other).

Figure 12:
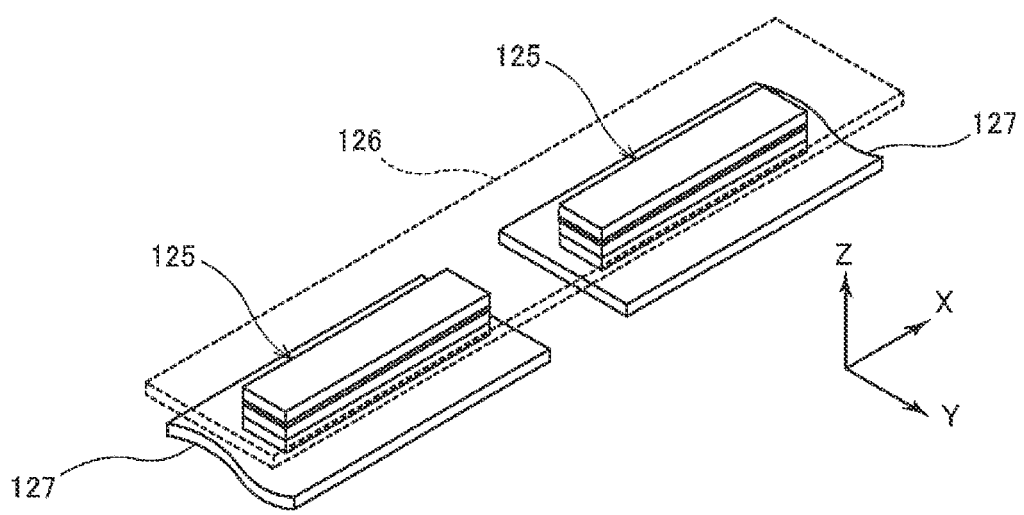
FIG. 12 is a perspective view showing a schematic configuration of a magnetic field detection unit according to an embodiment of the present invention.

The magnetoresistive effect element 120 may be one in which a plurality of MR laminated bodies 125 having substantially rectangular shapes when viewed along the Z direction are connected in series via an upper lead electrode 126 and a lower lead electrode 127 (see FIG. 12). Although a current flows through the MR laminated body 125 shown in FIG. 12 in the lamination direction (+Z direction, −Z direction), the magnetoresistive effect element 120 in the present embodiment may be an element of the CIP (Current In Plane) type in which current flows in the in-plane direction of the MR laminated body 125 (for example, the +X direction or the −X direction). The upper lead electrode 126 and the lower lead electrode 127 are composed of, for example, one kind of conductive material or a composite file of two or more kinds of conductive materials, of Cu, Al, Au, Ta, Ti or the like. A substantially rectangular shape means a rectangular shape in which the length in the X direction is longer than the length in the Y direction when viewed along the Z direction, and also includes a quadrilateral in which the length in the X direction is longer than the length in the Y direction and the four corners are 89~91°, and a quadrilateral with rounded corners in which the length in the X direction is longer than the length in the Y direction and the four corners are rounded. In the present embodiment, the shape of the MR laminated body 125 when viewed along the Z direction is not limited to a substantially rectangular shape, and may be, for example, an elliptical shape, an oval shape, or the like. In such cases as well, the major axis of an elliptical shape, an oval shape, or the like can be the X direction and the minor axis can be the Y direction when viewed along the Z direction.

The plurality of lower lead electrodes 127 has, for example, a substantially rectangular shape, is arranged so that there is a predetermined gap between two adjacent lower lead electrodes 127 in the electrical series direction of the plurality of MR laminated bodies 125 and so that the plurality of MR laminated bodies 125 is connected in series, and two adjacent MR laminated bodies 125 are electrically connected to each other. MR laminated bodies 125 are provided near both ends of the lower lead electrode 127 in the longitudinal direction. That is, two MR laminated bodies 125 are provided on each of the plurality of lower lead electrodes 127.

The plurality of upper lead electrodes 126 is provided on the plurality of MR laminated bodies 125. Each upper lead electrode 126 has, for example, an elongated substantially rectangular shape. The upper lead electrodes 126 are arranged so that there is a predetermined gap between two adjacent upper lead electrodes 126 in the electrical series direction of the plurality of MR laminated bodies 125 and so that the plurality of MR laminated bodies is connected in series, and two adjacent MR laminated bodies 125 are electrically connected to each other. A cap layer (protective layer) may be provided between the free layer 121 and the lower lead electrode 127 or the upper lead electrode 126.

When viewed along the Z direction, in each of the first magnetic field detection unit R1 and the fourth magnetic field detection unit R4, the plurality of magnetoresistive effect elements 120 included in the first magnetoresistive units R11 and R41 is arranged on the +Y side of the magnetic field conversion unit 11 (yoke 111) closest to each magnetoresistive effect element 120 in the Y direction, and the plurality of magnetoresistive effect elements 120 included in the second magnetoresistive units R12 and R42 is arranged on the −Y side of the magnetic field conversion unit 11 (yoke 111) closest to each magnetoresistive effect element 120 in the Y direction (see FIGS. 8A~8D). Furthermore, in each of the second magnetic field detection unit R2 and the third magnetic field detection unit R3, the plurality of magnetoresistive effect elements 120 included in the first magnetoresistive units R21 and R31 is arranged on the −Y side of the magnetic field conversion unit 11 (yoke 111) closest to each magnetoresistive effect element 120 in the Y direction, and the plurality of magnetoresistive effect elements 120 included in the second magnetoresistive units R22 and R32 is arranged on the +Y side of the magnetic field conversion unit 11 (yoke 111) closest to each magnetoresistive effect element 120 in the Y direction (see FIGS. 8A~8D) The plurality of magnetoresistive effect elements 120 is arranged in linearly symmetrical positions centered on an axis passing through the center of the magnetic field conversion unit 11 (yoke 111) in the lateral direction (an axis that extends in the longitudinal direction of the magnetic field conversion unit 11 (yoke 111)). (See FIG. 8A~8D). The aspects shown in FIGS. 8A~8D are intended to be illustrative and not limiting, for the length between the above-described axis of at least one magnetic field conversion unit 11 (yoke 111) and the magnetoresistive effect element 120 arranged on the +Y side of that magnetic field conversion unit 11 (yoke 111), and the length between the above-described axis of the magnetic field conversion unit 11 (yoke 111) and the magnetoresistive effect element 120 arranged on the −Y side of that magnetic field conversion unit 11 (yoke 111) may be substantially the same as each other, or may differ from each other. The two lengths being substantially the same as each other means that the ratio of the two lengths is on the order of 1:0.95~1:1.05. Furthermore, the plurality of magnetoresistive effect elements 120 need not be arranged at linearly symmetrical positions centered on the above-described axis of at least one magnetic field conversion unit 11 (yoke 111).

The magnetic shield 13 includes a first magnetic shield 131 and a second magnetic shield 132 located so that the magnetic field conversion unit 11 and the magnetic field detection unit 12 are interposed therebetween when viewed along the Z direction (see FIG. 9 to FIG. 12). That is, the magnetic shield 13 overlaps the magnetic field conversion unit 11 and the magnetic field detection unit 12 when viewed along the Z direction. As long as the efficacy of the magnetic sensor device of the present embodiment is accomplished, the magnetic shield 13 may overlap a portion of the magnetic field conversion unit 11 and the magnetic field detection unit 12 when viewed along the Z direction or may overlap all of the magnetic field conversion unit 11 and the magnetic field detection unit 12. When viewed along the Z direction, the first magnetic shield 131 is located in the +Z direction (above) from the magnetic field conversion unit 11 and the magnetic field detection unit 12, and the second magnetic shield 132 is located in the −Z direction (below) from the magnetic field conversion unit 11 and the magnetic field detection unit 12. The first magnetic shield 131 and the second magnetic shield 132 can both have shapes in which the maximum length in the Y direction is shorter than the maximum length in the X direction when viewed along the Z direction, and for example, can have the shape of a rectangle, a quadrilateral with four corners of 89~91°, a rounded rectangle with four rounded corners, a shape with the four corners of a rectangle chamfered (octagonal shape), an oval shape including elliptical shapes, a shape in which the two opposite short sides of a rectangle are arc-shaped, a trapezoid, a parallelogram, a rhombus or the like. When the magnetic shield 13 that includes the first magnetic shield 131 and the second magnetic shield 132 has a quadrilateral shape such as a quadrilateral the four corners of which are 89~91°, a trapezoidal shape, a rhombus or the like, at least one set of two opposing sides of the two sets of two opposing sides may be parallel, or the two sets of two opposing sides may all be nonparallel.

The magnetic shield 13 may be made of, for example, a soft magnetic material. Examples of the soft magnetic material include NiFe and the like. When the magnetic shield 13 is composed of NiFe, the magnetic shield 13 is preferably composed of NiFe in which the percentage of Ni is 35~60% by mass in order to reduce the thermal stress of the magnetic shield 13. With NiFe having such a composition, the coefficient of thermal expansion can be reduced. When the magnetic properties of the magnetic shield 13 are also considered, the magnetic shield 13 is preferably composed of NiFe in which the percentage of Ni is 40~60% by mass. One of the abilities required of the magnetic shield 13 is that the maximum magnetic flux absorption amount be large. The maximum magnetic flux absorption amount of the magnetic shield 13 is substantially proportional to the product of the saturation magnetization of the magnetic shield 13 and the thickness (dimension in the Z direction). In order to ensure the performance of the magnetic shield 13, the product of the saturation magnetization and the thickness of the magnetic shield 13 that is, the magnetic moment per unit area, is preferably 0.6 emu/cm$^2$ or greater.

In the present embodiment, the magnetic shield 13 includes the first magnetic shield 131 located above (+Z side), which is one side of, the magnetic field conversion unit 11 and the magnetic field detection unit 12 when viewed along the Z direction, and the second magnetic shield 132 located below (−Z side), which is the other side of, the magnetic field conversion unit 11 and the magnetic field detection unit 12, but as long as the function of the magnetic shield 13 is performed, either the first magnetic shield 131 or the second magnetic shield 132 may be omitted. Further ore, at least one of the first magnetic shield 131 and the second magnetic shield 132 may have a mode in which a plurality of magnetic shields is arranged in parallel in the Y direction. By having the plurality of magnetic shields be arranged in parallel in the Y direction, it is possible to make the installable area of the magnetic field conversion unit 11 and the magnetic field detection unit 12 relatively large. Furthermore, when the gap between the magnetic shields parallel in the Y direction (gap in the Y direction) is relatively narrow, the magnetic shield tends to become saturated, but by relatively widening the gap, it is possible to prevent the magnetic shield from readily becoming saturated. Furthermore, at least one of the first magnetic shield 131 and the second magnetic shield 132 may have a mode in which a plurality of magnetic shields is arranged in parallel in the X direction or the Z direction.

The circuit configuration of the magnetic field detection unit 12 in the present embodiment can be a Wheatstone bridge circuit C in which four magnetic field detection units (first to fourth magnetic field detection units R1~R4) are bridge-connected (see FIGS. 13A~13D). For example, the Wheatstone bridge circuit C constituting the magnetic field detection unit 12 can having a first bridge circuit C1 including the first magnetic field detection unit R1 and the second magnetic field detection unit R2 and a second bridge circuit C2 including the third magnetic field detection unit R3 and the fourth magnetic field detection unit R4 connected in parallel.

The Wheatstone bridge circuit C constituting the magnetic field detection unit 12 includes a power supply port V, a ground port G, a first output port E1, a second output port E2, the first magnetic field detection unit R1 provided between the power supply port V and the first output port E1, the second magnetic field detection unit R2 provided between the first output port E1 and the ground port G, the third magnetic detection unit R3 provided between the power supply port V and the second output port E2, and the fourth magnetic field detection unit R4 provided between the second output port E2 and the ground port G. A power supply voltage (constant current) of a predetermined magnitude is applied on the power supply port V by connecting a constant current source, and the ground port G is connected to ground. The constant current applied on the power supply port V is controlled to a predetermined current value by a driver IC not shown in the drawings.

In the present embodiment, the magnetization directions of the magnetization fixed layers 123 in the MR laminated bodies 125 included in the first magnetoresistive units R11 to R41 of the first to fourth magnetic field detection units R1~R4 (solid arrows shown in FIGS. 14A~16D) are fixed in the same direction (+Y direction) as each other (see FIGS. 14A~16D), On the other hand, the magnetization directions of the magnetization fixed layers 123 in the MR laminated bodies 125 included in the second magnetoresistive units R21~R42 of the first to fourth magnetic field detection units R1~R4 (solid arrows shown in FIGS. 14A~16D) are fixed in the same direction (−Y direction) as each other (see FIGS. 14A~16D). The magnetization directions of the magnetization fixed layers 123 in all MR laminated bodies 125 can be fixed substantially along the Y direction, and in this case, the magnetization directions of the magnetization fixed layers 123 in each MR laminated body 125 included in the first magnetoresistive units R11~R41 can be inclined at an angle within 10° of the +Y direction, and the magnetization directions of the magnetization fixed layers 123 in each MR laminated body 125 included in the second magnetoresistive units R21~R42 can be inclined at an angle within 10° of the −Y direction. All MR laminated bodies 125 have a shape that is long in the X direction (for example, substantially rectangular shape, elliptical shape, oval shape, or the like) when viewed along the Z direction. Therefore, the free layer 121 in each MR laminated body 125 has shape anisotropy in which the axial direction for easy magnetization is the X direction. As a result, the magnetization directions (the dashed arrows shown in FIGS. 14A~14D) of the free layers 121 in all MR laminated bodies 125 in the initial state (the state in which the second magnetic field component H2 output from the magnetic field conversion unit 11 (yoke 111) is not applied) are the same as each other and are in an orthogonal direction (+X direction) to the magnetization direction of the magnetization fixed layer 123 (see FIGS. 14A~14D). Because the magnetization directions of the magnetization fixed layer 123 and the free layer 121 are in the above directions, the potential difference between the first output port E1 and the second output port E2 changes accompanying changes in the resistance values of the first through fourth magnetic field detection units R1~R4 in accordance with the second magnetic field component H2, and a signal is output as the change in the potential difference.

In the magnetic sensor device of the present embodiment, when the first magnetic field component H1 parallel to the Z direction, of the partial magnetic field that is a part of the magnetic field generated from the first magnet 21 is input to the magnetic field conversion unit 11, this is converted to the second magnetic field component H2 parallel to the Y direction by the conversion unit 11 and output. The second magnetic field component H2 in the +Y direction is applied on the magnetoresistive effect elements 120 included in the first magnetoresistive units R11 and R41 of the first magnetic field detection unit R1 and the fourth magnetic field detection unit R4, respectively, and the second magnetic field component H2 in the −Y direction is applied on the magnetoresistive effect elements 120 included in the second magnetoresistive units R12 and R42, and the magnetization direction of each free layer 121 changes accordingly (see FIGS. 15A~15D). On the other hand, second magnetic field component H2 in the −Y direction is applied on the magnetoresistive effect elements 120 included in the first magnetoresistive units R21 and R31 of the second magnetic field detection unit R2 and the third magnetic field detection unit R3, respectively, and the second magnetic field component H2 in the +Y direction is applied on the magnetoresistive effect elements 120 included in the second magnetoresistive units R22 and R32, and the magnetization direction of each free layer 121 changes accordingly (see FIGS. 15A~15D). As a result, the angles θ11, θ12, θ41 and θ42 formed by the mutual magnetizations of the free layers 121 and the magnetization fixed layers 123 in the first magnetoresistive units R11 and R41 and the second magnetoresistive units R12 and R42 of the first magnetic field detection unit R1 and the fourth magnetic field detection unit R4, respectively, are less than 90° (see FIGS. 15A~15D), On the other hand, the angles θ21, θ22, θ31 and θ32 formed by the mutual magnetizations of the free layers 121 and the magnetization fixed layers 123 in the first magnetoresistive units R21 and R31 and the second magnetoresistive units R22 and R32 of the second magnetic field detection unit R2 and the third magnetic field detection unit R3, respectively, exceed 90° (see FIGS. 15A~15D). In FIGS. 15A~15D, the dashed arrows indicate the magnetization of the free layer 121 whose direction has changed due to the applying of the second magnetic field component H2, and the white dashed arrows indicate the magnetization direction of the free layer 121 in the initial state.

As described above, the partial magnetic field that is a part of the magnetic field generated from the first magnet 21 includes magnetic field components parallel to the Y direction. Most of the magnetic field components in the Y direction are absorbed by the magnetic shield 13, but not all of the magnetic field components are completely absorbed by the magnetic field 13, and a part of these are applied on the magnetoresistive effect element 120 as the bias magnetic field component Hb and cause the magnetization direction of the free layer 121 to change (see FIGS. 16A~16D). In FIGS. 16A~16D, the dashed arrows represent the magnetization of the free layer 121 whose direction has changed due to the impressing of the second magnetic field component H2 and the bias magnetic field component Hb, and the white dashed arrows represent the magnetization direction of the free layer 121 in the initial state. As a result, the angles θ11', θ21', θ31', θ41', θ12', θ22', θ32' and θ42' (see FIG. 16A~16D) formed by the mutual magnetization of the free layer 121 and the magnetization fixed layer 123 in the first magnetoresistive units R11~R41 and the second magnetoresistive units R12~R42 of the first to fourth magnetic field detection units R1~R4, respectively, are smaller than the angles θ11, θ21, θ31, θ41, θ12, θ22, θ32, and θ42 (see FIGS. 15A to 15D) that would be shown when the bias magnetic field component Hb is not applied. As a result, the respective outputs of the first output port E1 and the second output port E2 fluctuate.

However, in the present embodiment, the magnetization of the magnetization fixed layer 123 of all of the magnetoresistive effect elements 120 included in the first to fourth magnetic field detection units R1~R4 is fixed along the Y direction, and the magnetization of the free layer 121 of all of the magnetoresistive effect element 120 in the initial state is in the same direction, and consequently when the bias magnetic field component Hb is applied on the magnetoresistive effect element 120, the fluctuation amount of the output of the first output port E1 and the fluctuation amount of the output of the second output port E2 are substantially the same. When the fluctuation amount of the output of the first output port E1 and the fluctuation amount of the output of the second output port E2 differ due to the bias magnetic field component Hb, there is a concern that the output from the magnetic sensor device may be offset, but in the present embodiment, it is possible to suppress the occurrence of an offset of the output from the magnetic sensor device. Furthermore, in the present embodiment, since the magnetization direction of the free layer 121 in the initial state is orthogonal to the bias magnetic field component Hb, it is possible to suppress a decrease in the sensitivity of the magnetic sensor device. Furthermore, in the present embodiment, because each of the first to fourth magnetic field detection units R1~R4 has the first magnetoresistive units R11~R41 that include the magnetoresistive effect elements 120 having magnetization fixed layers 123 in which the magnetization is fixed in the +Y direction and the second magnetoresistive units R12~R42 that include the magnetoresistive effect elements 120 having magnetization fixed layers 123 in which the magnetization is fixed in the −Y direction, it is possible to offset resistance fluctuations in the first magnetoresistive units R11~R41 and resistance fluctuations in the second magnetoresistive units R12~R42 arising because of the bias magnetic field Hb, so it is possible to suppress fluctuation of the midpoint potential of the magnetic sensor device. In particular, when a constant current is applied on the power supply port V, when the first magnetoresistive units R11~R41 and the second magnetoresistive units R12~R42 included in the first to fourth magnetic field detection units R1 to R4, respectively, are connected in parallel (see FIGS. 8B and 13B), the effect of suppressing fluctuation of the midpoint potential of the magnetic sensor device is remarkably excellent. In the present embodiment, the midpoint potential means the potential from ground G of the output of the first output port E1 and the output of the second output port E2 of the Wheatstone bridge circuit C constituting the magnetic sensor 10 when the magnetic field (second magnetic field H2) to be detected by the magnetic sensor 10 is zero.

In a case in which the magnetization direction of the magnetization fixed layer 123 is fixed in the Y direction in the magnetoresistive effect element 120 having a shape with the X direction as the longitudinal direction when viewed along the Z direction, when the bias magnetic field Hb in the Y direction is applied on the magnetoresistive effect element 120, the magnetization direction of the free layer 121 fluctuates. At this time, the resistance $R_{120}$ (Ω) of the magnetoresistive effect element 120 is represented by the following equation (1).

[Formula 1]

$$R_{120} = \frac{1}{G_{120} + \Delta G_{120} * \cos(90 - \delta\theta)} \quad (1)$$

In the above equation (1), $G_{120}$ represents "the conductance (Ω−1) of the magnetoresistive effect element 120", $\Delta G_{120}$ represents "the change amplitude of conductance (Ω−1) of the magnetoresistive effect element 120", and $\delta\theta$ represents "the amount of angular displacement (deg) of the magnetization of the free layer 121".

As is clear from the above equation (1), the resistance change of the magnetoresistive effect element 120 due to impressing of the second magnetic field component H2 as a result of the change in the magnetization direction of the free layer 121 due to the influence of the bias magnetic field Hb in the Y direction, that is, the output from the magnetic sensor device, deviates from an ideal sinusoidal wave. That is, the bias magnetic field Hb in the Y direction results in fluctuations in the midpoint potential.

Figure 8A:
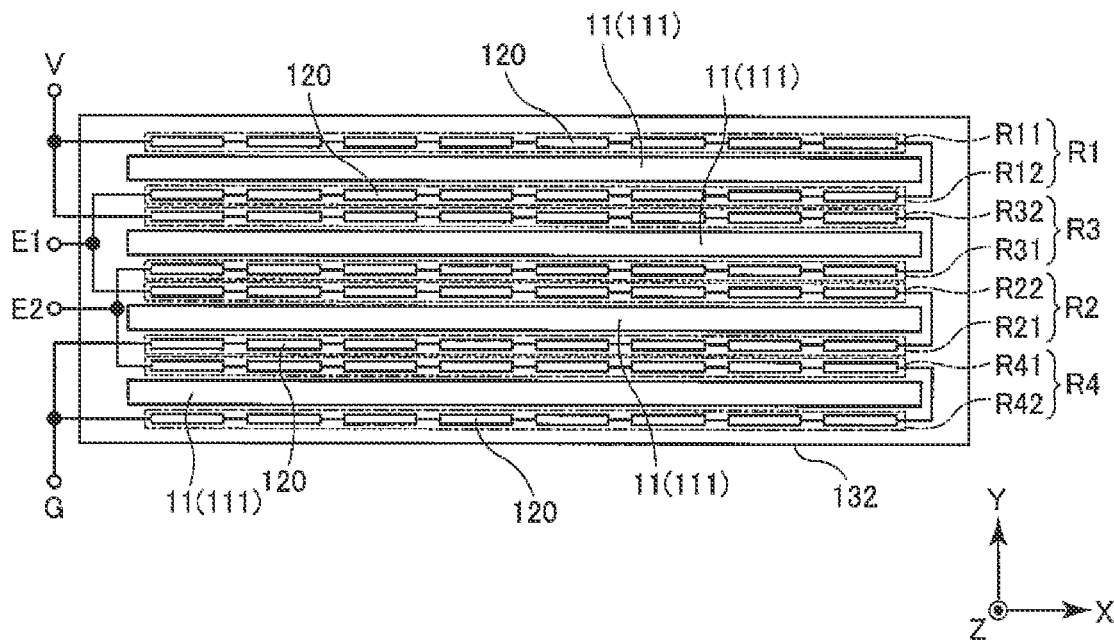
FIG. 8A is a plan view showing a schematic configuration of a magnetic sensor according to an embodiment of the present invention.
Figure 13A:
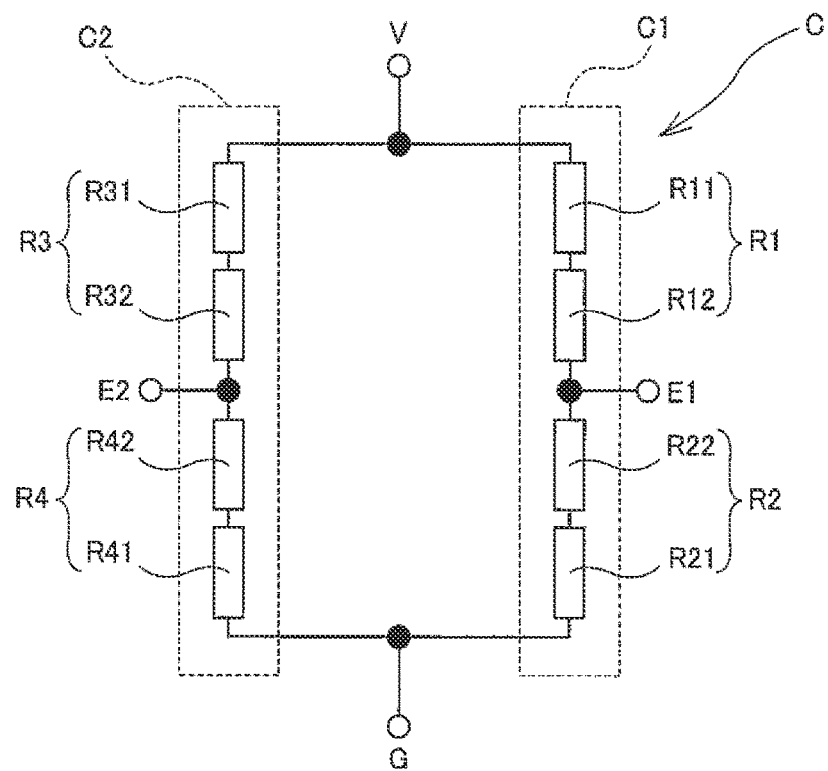
FIG. 13A is a circuit diagram showing a circuit configuration of a magnetic field detection unit according to an embodiment of the present invention.

As shown in FIGS. 8A and 13A, when the first magnetoresistive units R11~R41 and the second magnetoresistive units R12~R42 of the first to fourth magnetic field detection units R1~R4 are connected in series, each resistance R of the first to fourth magnetic field detection units R1~R4 can be expressed by the following equation (2) from the resistance R1 (Ω) of the magnetoresistive effect elements 120 included in the first magnetoresistive units R11~R41 and the resistance R2 (Ω) of the magnetoresistive effect elements 120 included in the second magnetoresistive units R12~R42.

$$R = R1 + R2 \quad (2)$$

The magnetization direction of the magnetization fixed layer 123 of the magnetoresistive effect elements 120 included in the first magnetoresistive units R11~R41 and the magnetization direction of the magnetization fixed layer 123 of the magnetoresistive effect elements 120 included in the second magnetoresistive units R12~R42 are antiparallel to each other, and hence the influence of fluctuations in the magnetization direction of the free layer due to the bias magnetic field Hb in the Y direction on the output from the magnetic sensor device can be totally offset in each of the first to fourth magnetic field detection units R1~R4 and fluctuations in the midpoint potential can be suppressed, but as is clear from the above equation (2), there is a concern that the bias magnetic field Hb in the Y direction may cause a slight fluctuation in the midpoint potential.

Figure 8B:
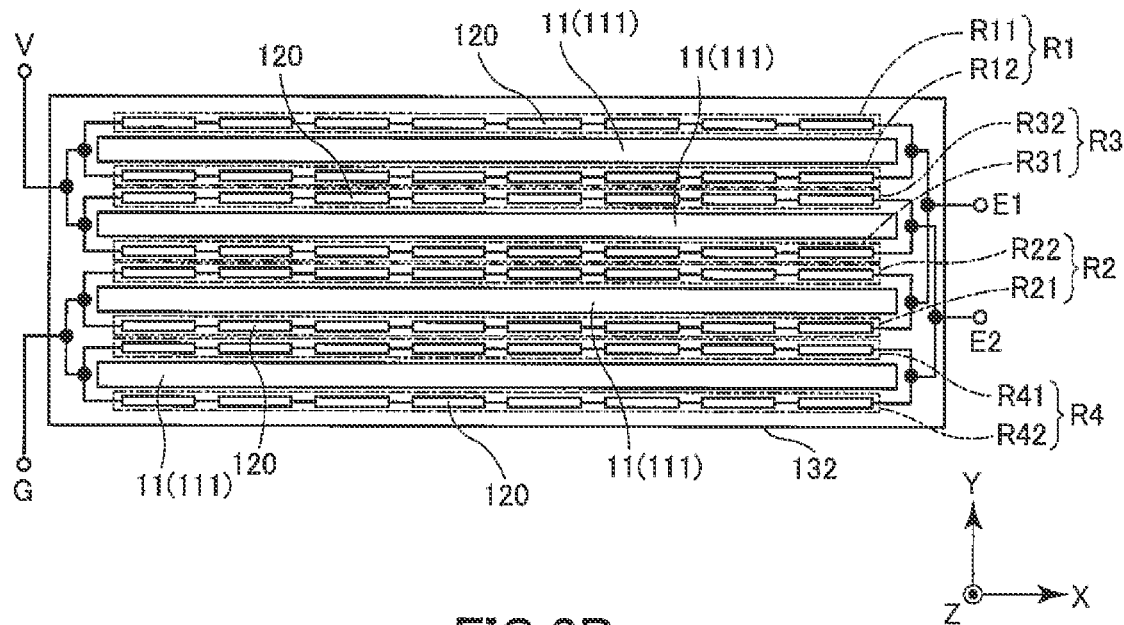
FIG. 8B is a plan view showing a schematic configuration of a magnetic sensor according to an embodiment of the present invention.
Figure 8C:
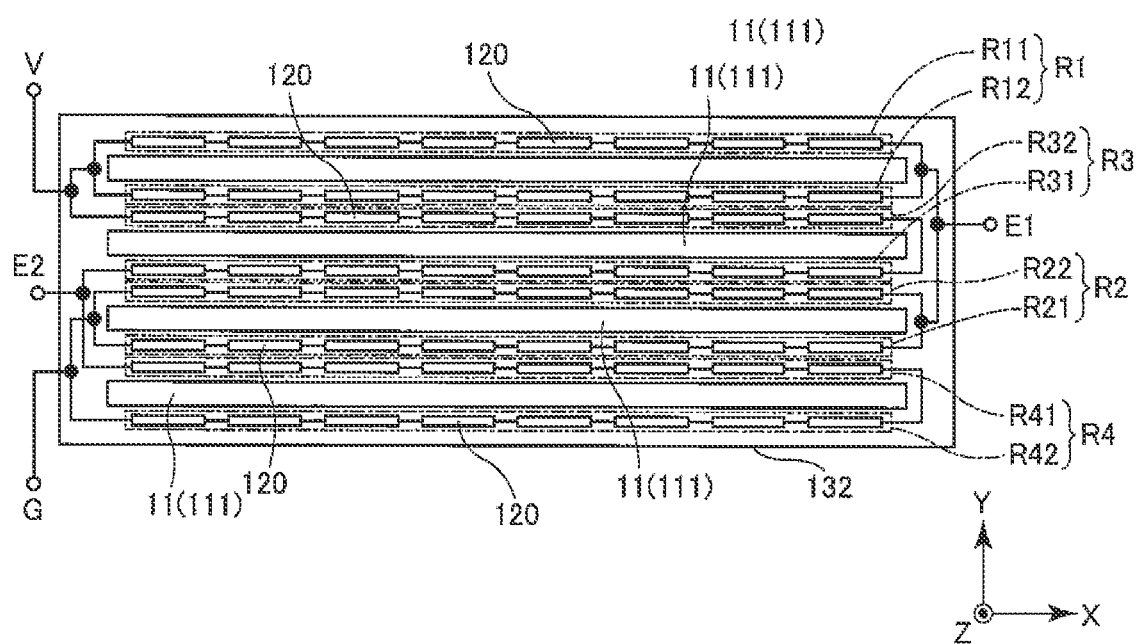
FIG. 8C is a plan view showing a schematic configuration of a magnetic sensor according to an embodiment of the present invention.
Figure 8D:
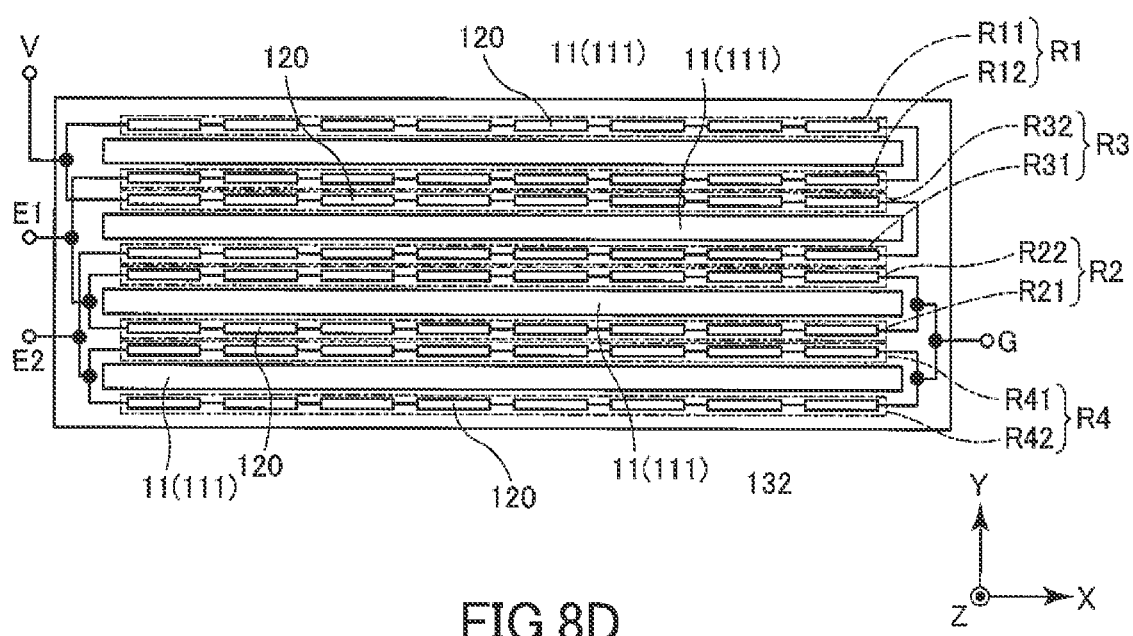
FIG. 8D is a plan view showing a schematic configuration of a magnetic sensor according to an embodiment of the present invention.
Figure 9:
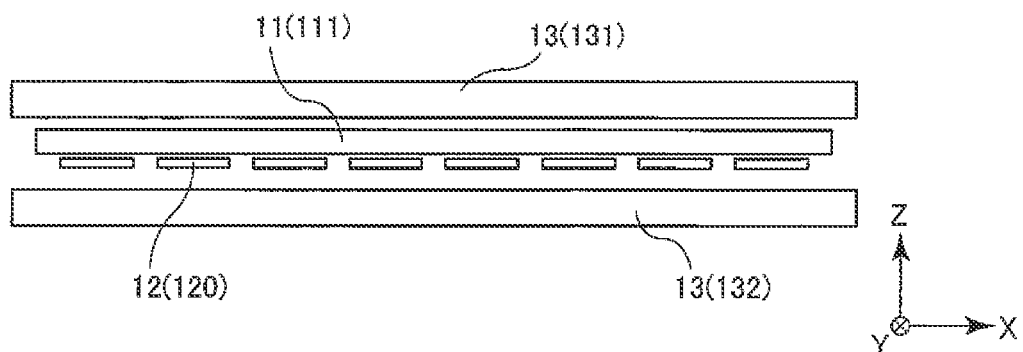
FIG. 9 is a side view showing a schematic configuration of a magnetic sensor according to an embodiment of the present invention.
Figure 10:
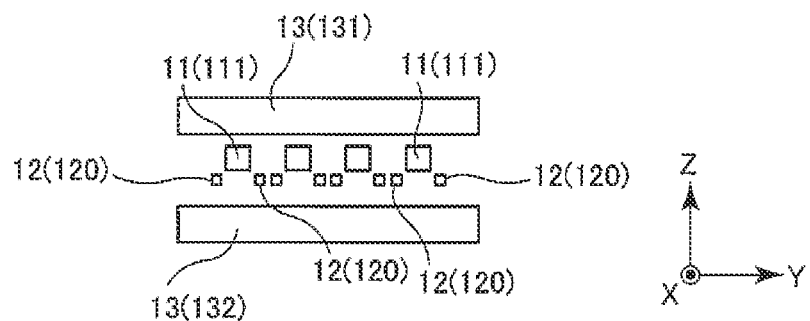
FIG. 10 is a side view showing a schematic configuration of a magnetic sensor according to an embodiment of the present invention.
Figure 13B:
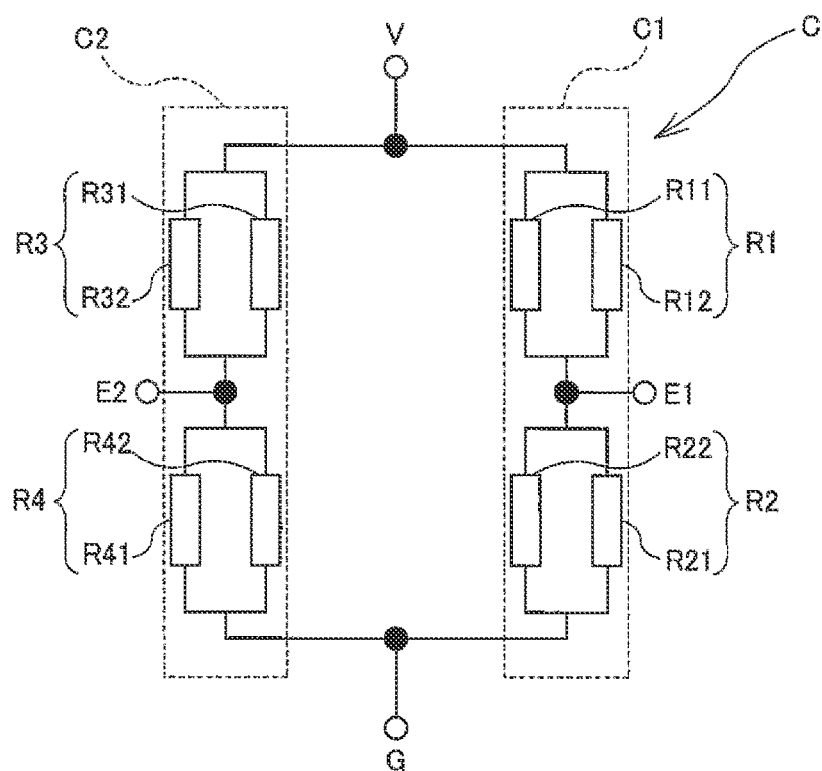
FIG. 13B is a circuit diagram showing a circuit configuration of a magnetic field detection unit according to an embodiment of the present invention.
Figure 13C:
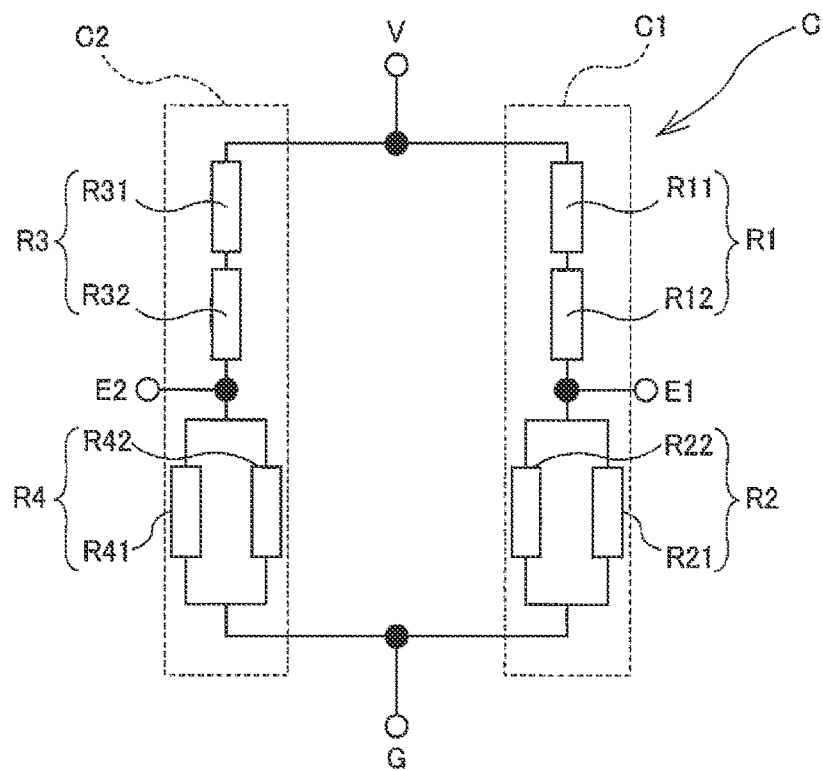
FIG. 13C is a circuit diagram showing a circuit configuration of a magnetic field detection unit according to an embodiment of the present invention.
Figure 13D:
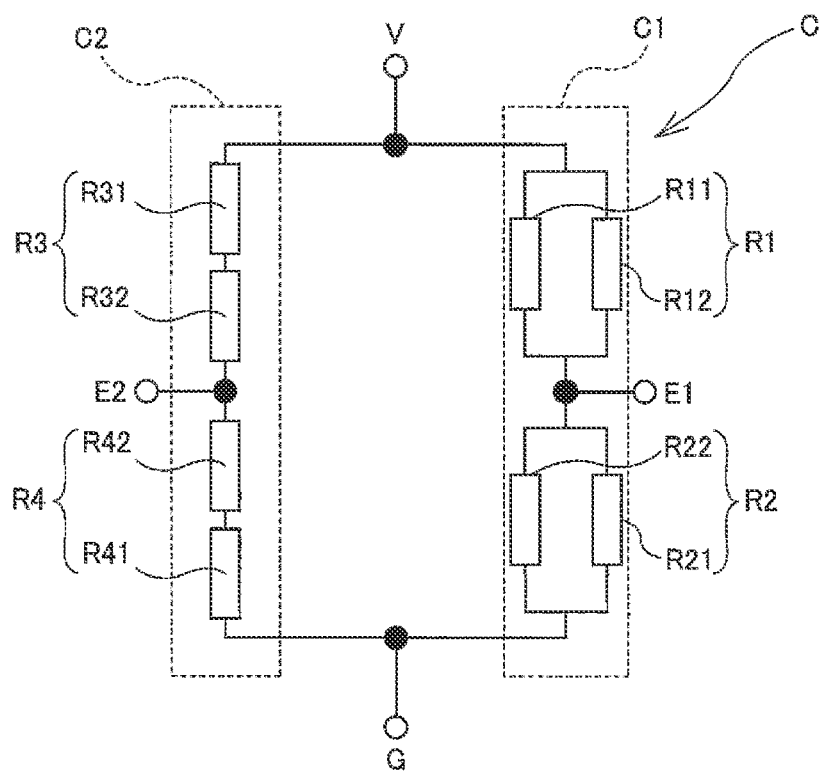
FIG. 13D is a circuit diagram showing a circuit configuration of a magnetic field detection unit according to an embodiment of the present invention.
Figure 14A:
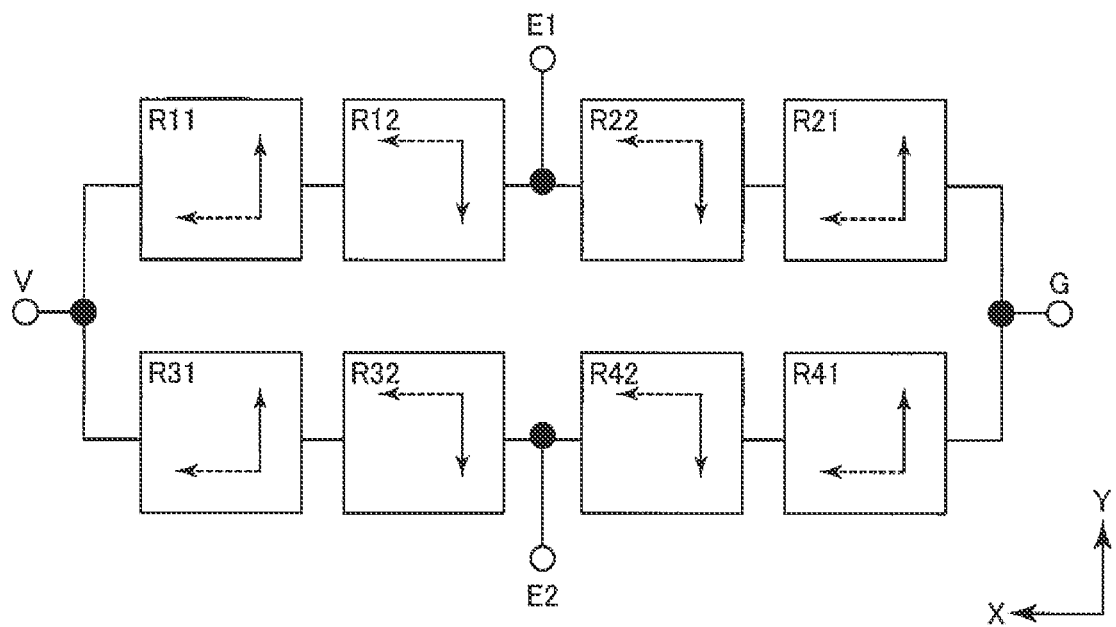
FIG. 14A is an explanatory diagram for explaining the magnetization directions in the initial state of the free layer and the magnetization fixed layer of the magnetoresistive effect element according to an embodiment of the present invention.
Figure 14B:
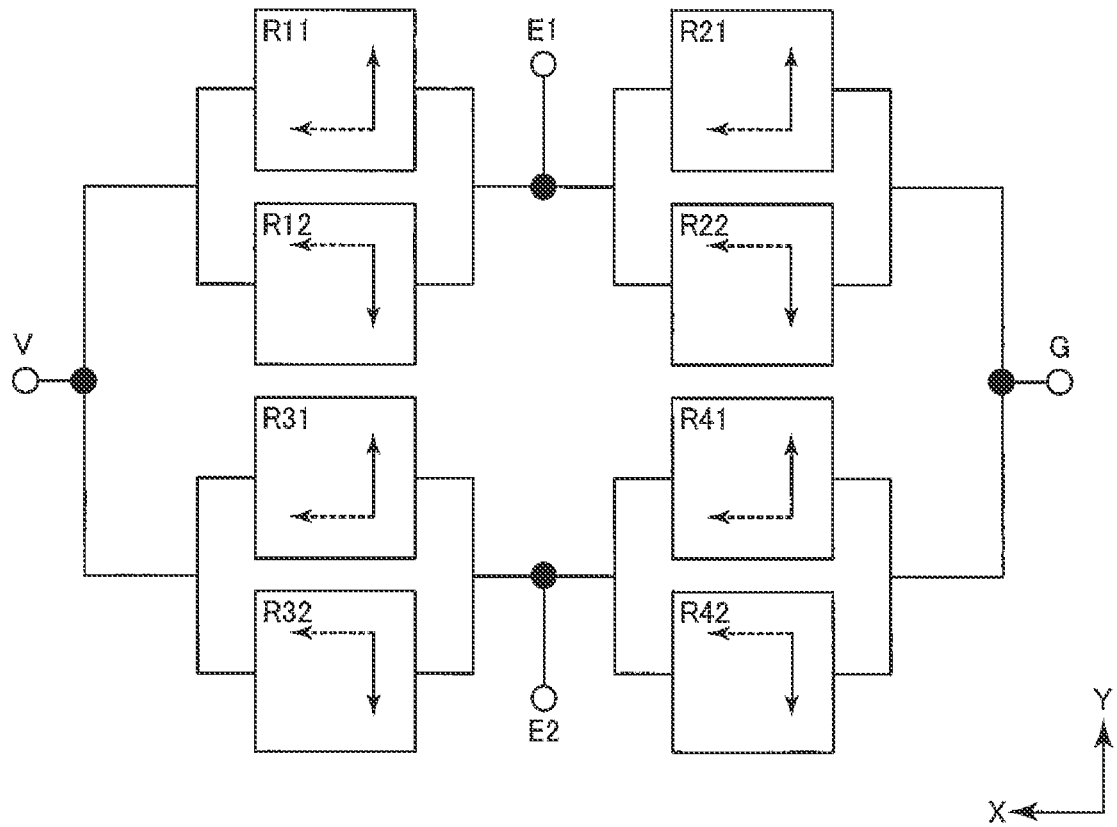
FIG. 14B is an explanatory diagram for explaining the magnetization directions in the initial state of the free layer and the magnetization fixed layer of the magnetoresistive effect element according to an embodiment of the present invention.
Figure 14C:
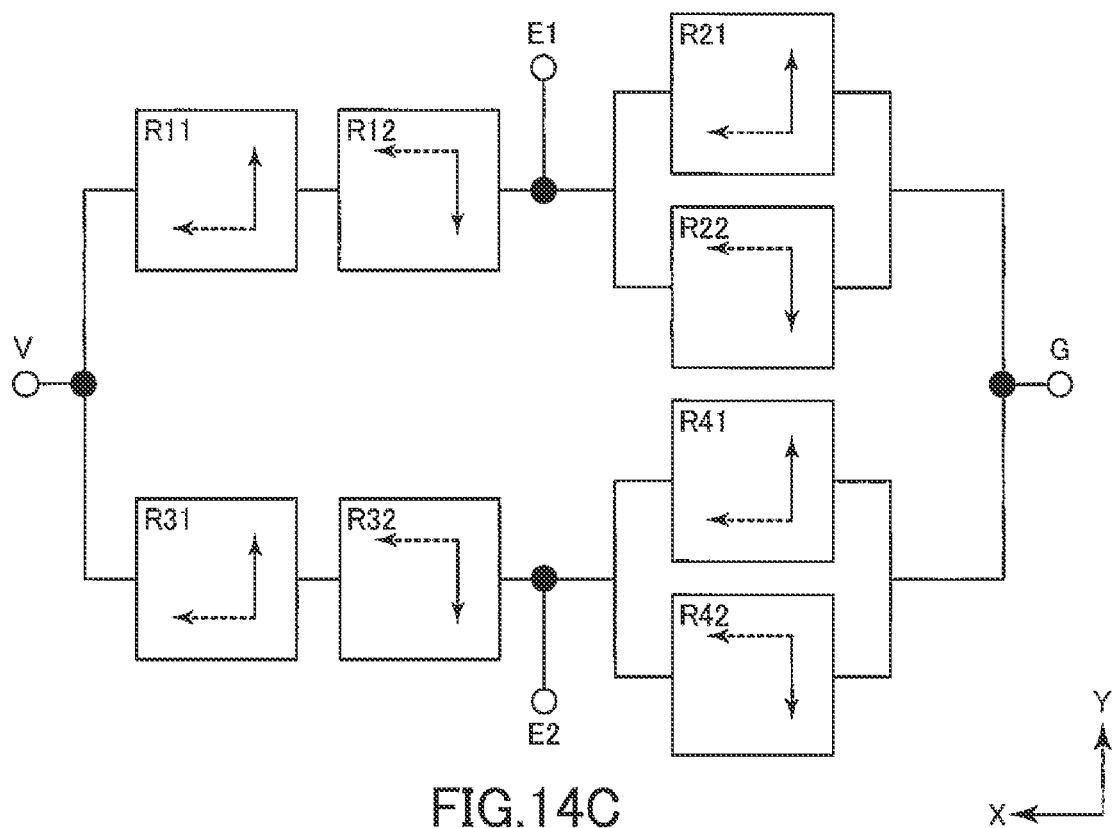
FIG. 14C is an explanatory diagram for explaining the magnetization directions in the initial state of the free layer and the magnetization fixed layer of the magnetoresistive effect element according to an embodiment of the present invention.
Figure 14D:
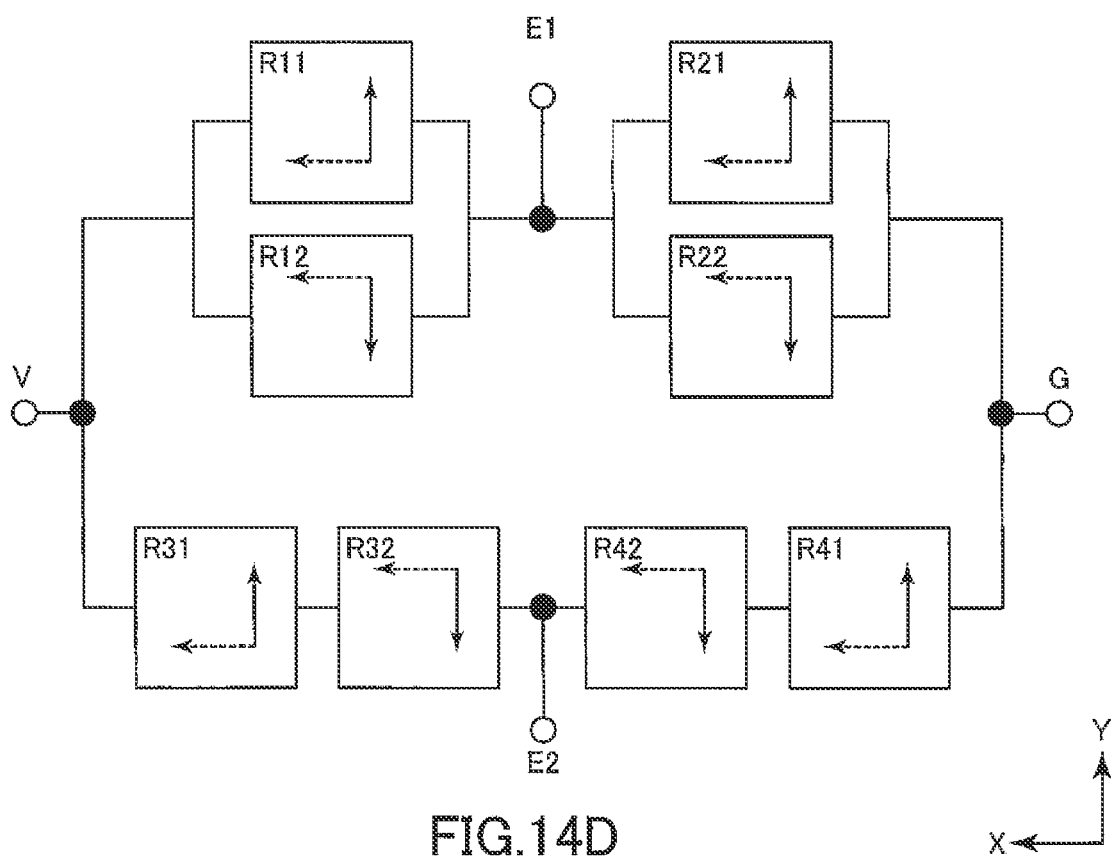
FIG. 14D is an explanatory diagram for explaining the magnetization directions in the initial state of the free layer and the magnetization fixed layer of the magnetoresistive effect element according to an embodiment of the present invention.
Figure 15A:
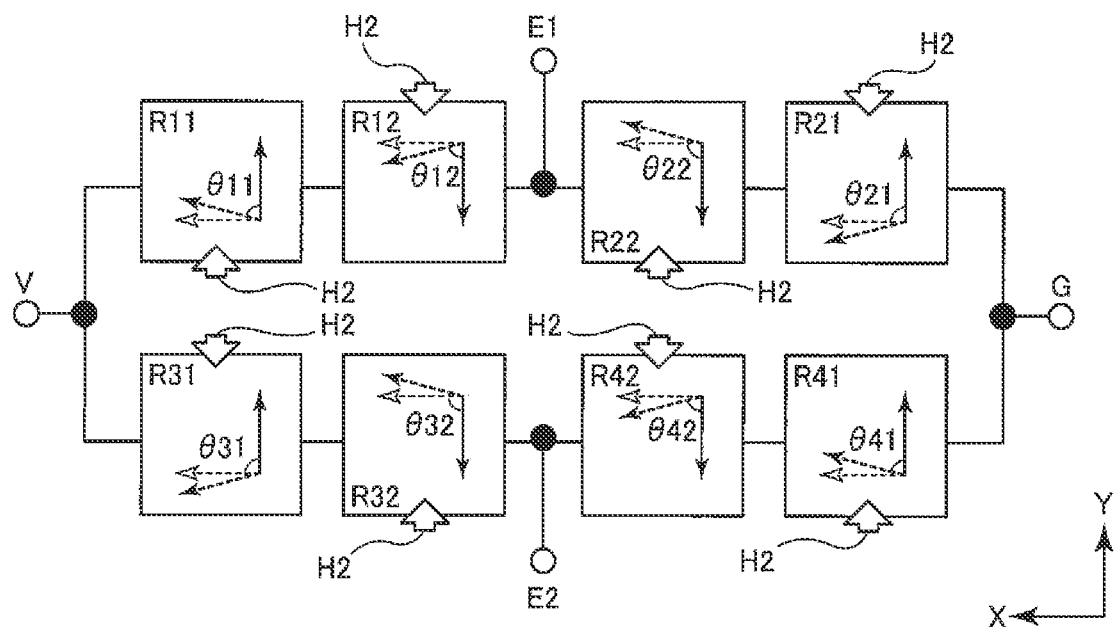
FIG. 15A is an explanatory diagram for explaining the magnetization directions of the free layer and the magnetization fixed layer when a second magnetic field component is applied on the magnetoresistive effect element according to an embodiment of the present invention.
Figure 15B:
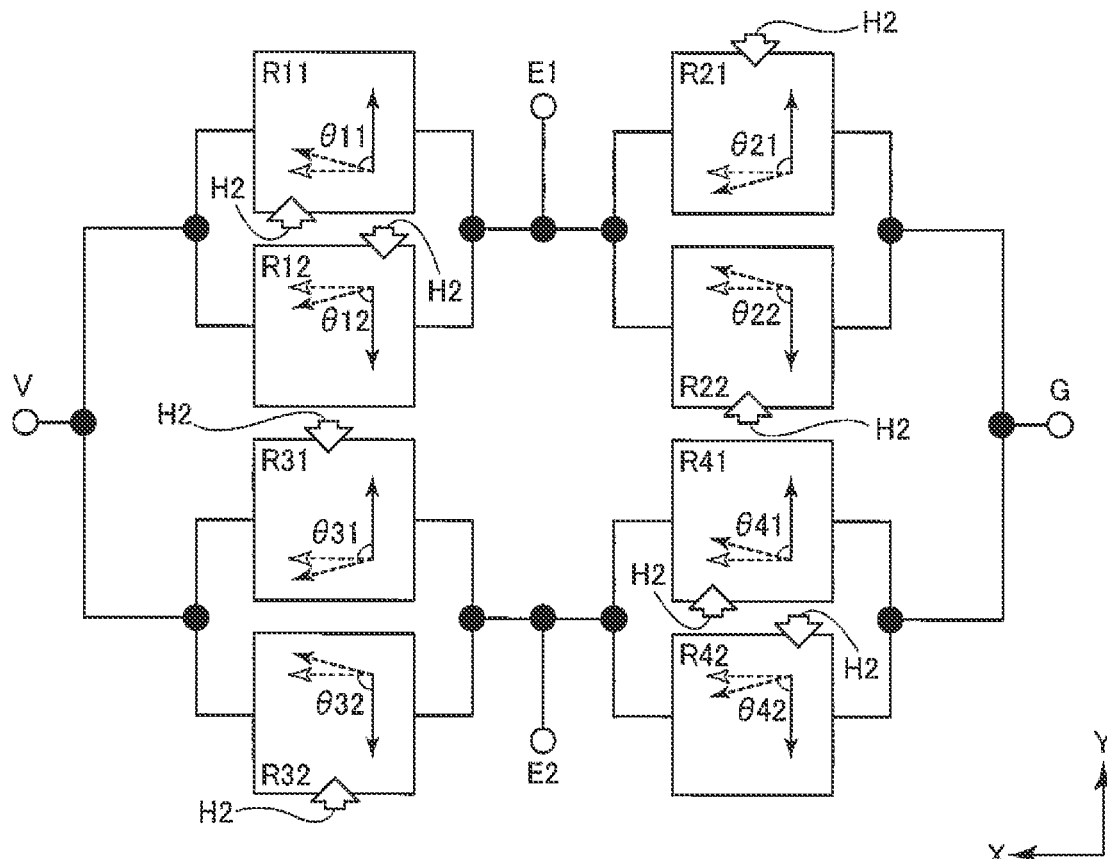
FIG. 15B is an explanatory diagram for explaining the magnetization directions of the free layer and the magnetization fixed layer when a second magnetic field component is applied on the magnetoresistive effect element according to an embodiment of the present invention.
Figure 15C:
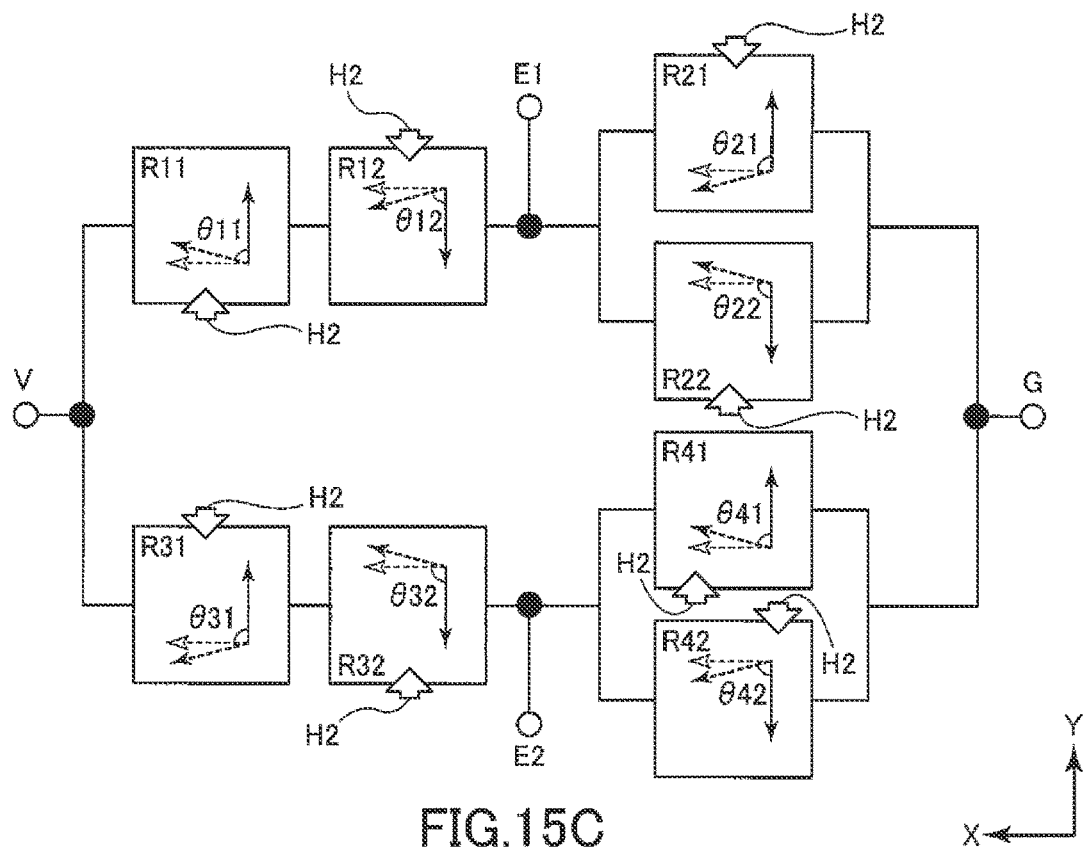
FIG. 15C is an explanatory diagram for explaining the magnetization directions of the free layer and the magnetization fixed layer when a second magnetic field component is applied on the magnetoresistive effect element according to an embodiment of the present invention.
Figure 15D:
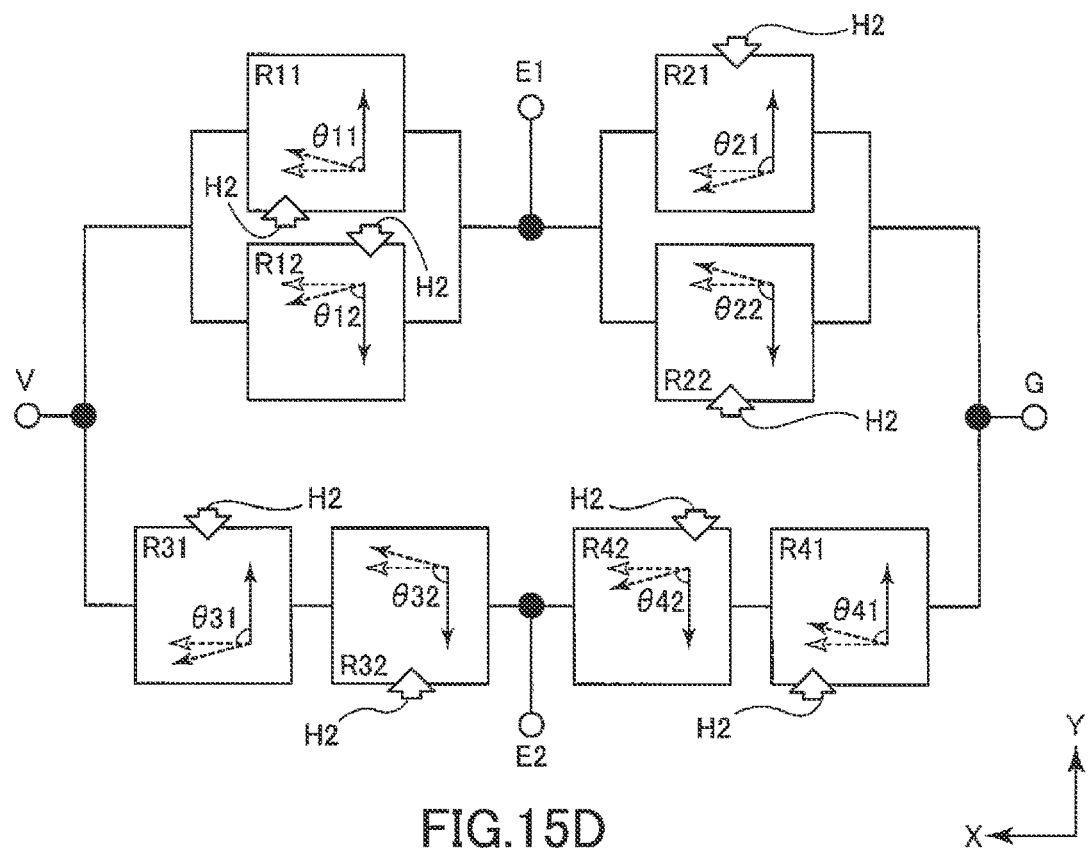
FIG. 15D is an explanatory diagram for explaining the magnetization directions of the free layer and the magnetization fixed layer when a second magnetic field component is applied on the magnetoresistive effect element according to an embodiment of the present invention.
Figure 16A:
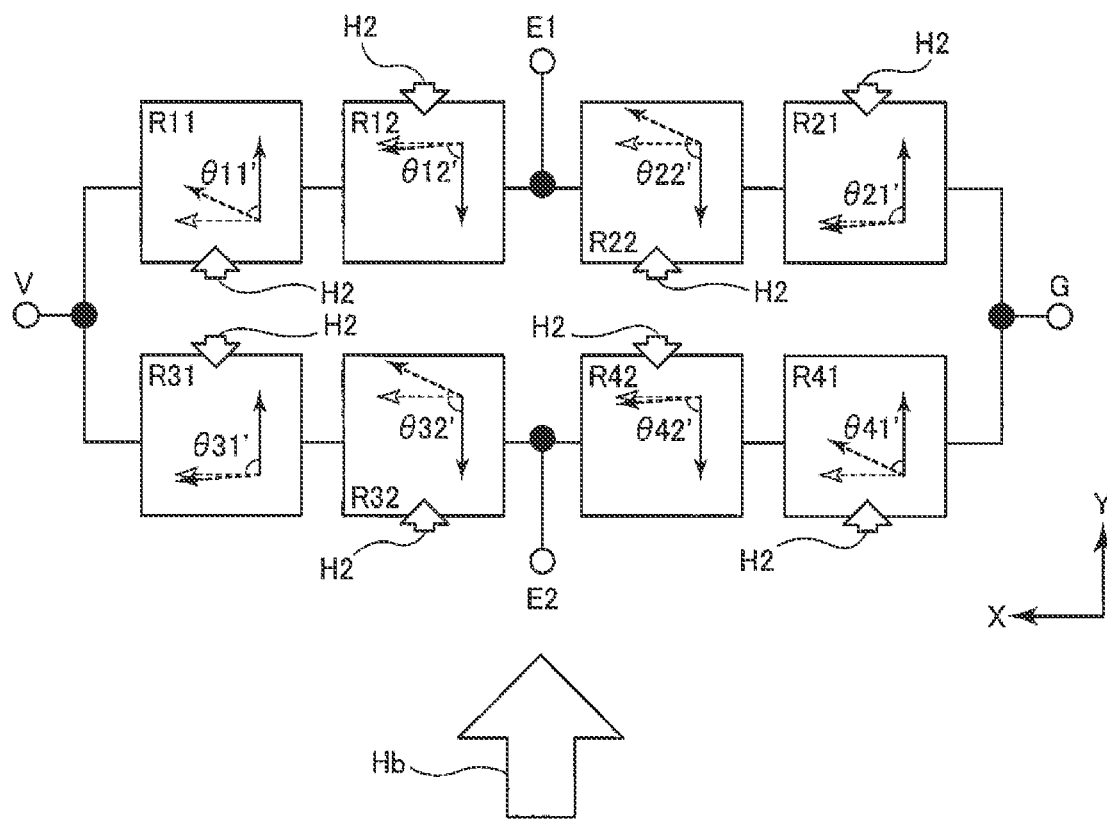
FIG. 16A is an explanatory diagram for explaining the magnetization directions of the free layer and the magnetization fixed layer when a second magnetic field component and a bias magnetic field component are applied on the magnetoresistive effect element according to an embodiment of the present invention.
Figure 16B:
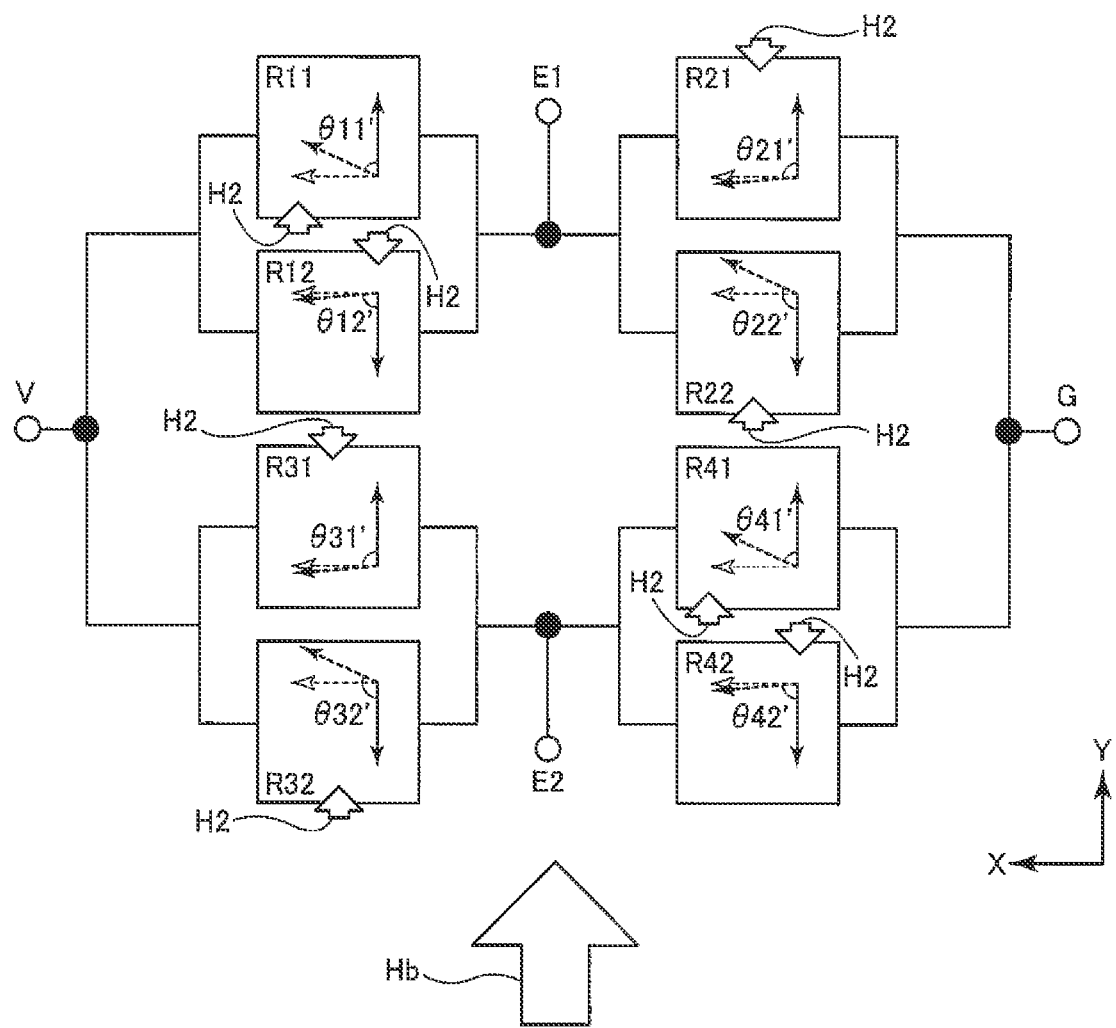
FIG. 16B is an explanatory diagram for explaining the magnetization directions of the free layer and the magnetization fixed layer when a second magnetic field component and a bias magnetic field component are applied on the magnetoresistive effect element according to an embodiment of the present invention.
Figure 16C:
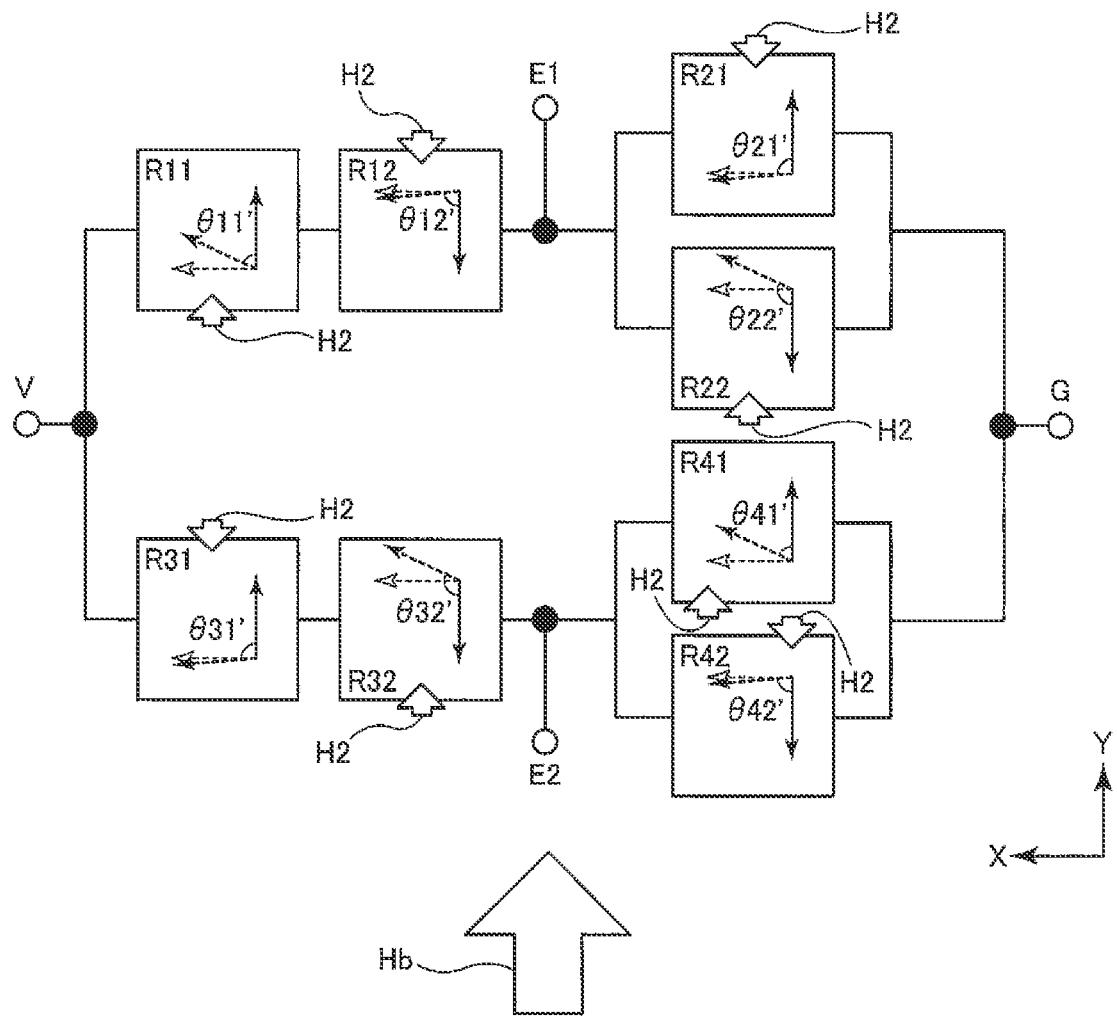
FIG. 16C is an explanatory diagram for explaining the magnetization directions of the free layer and the magnetization fixed layer when a second magnetic field component and a bias magnetic field component are applied on the magnetoresistive effect element according to an embodiment of the present invention.
Figure 16D:
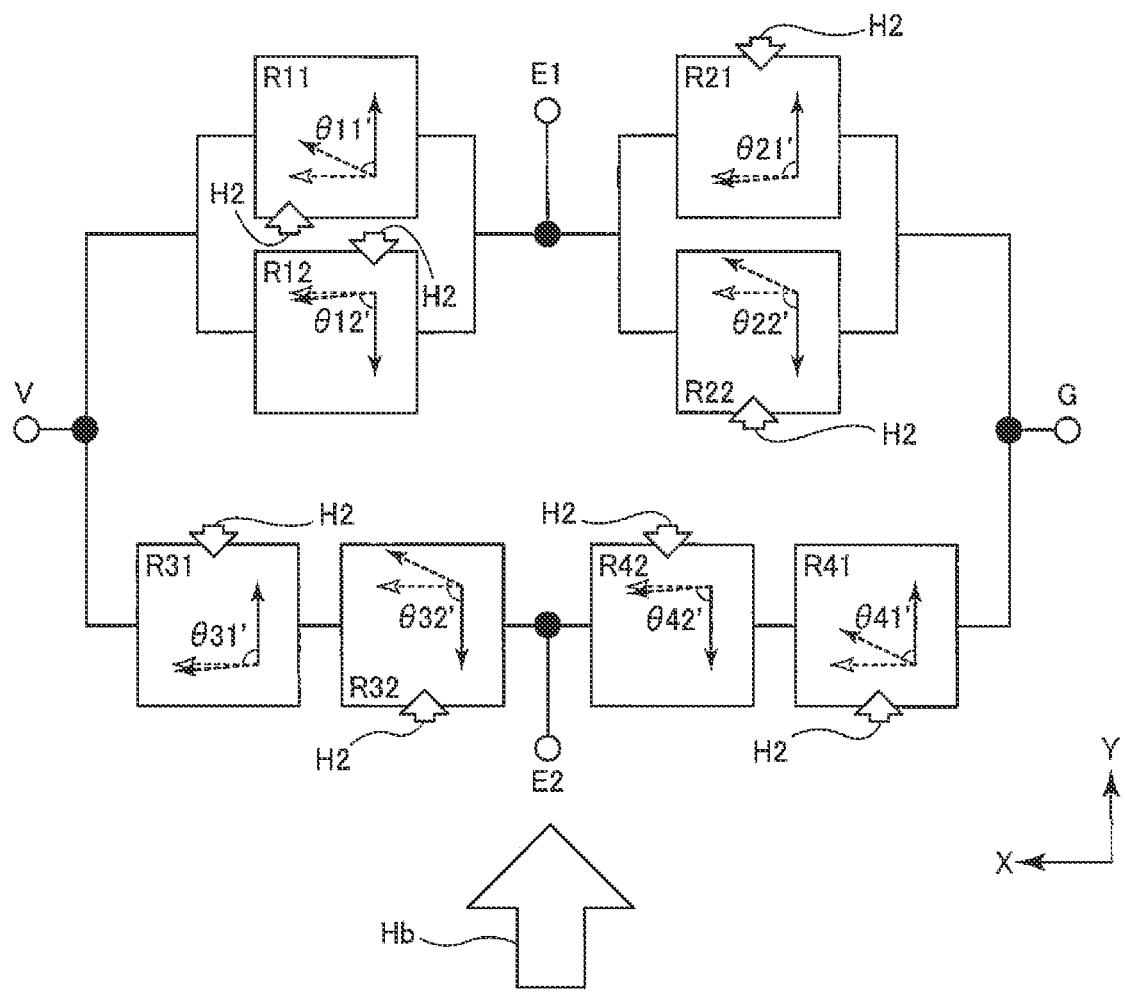
FIG. 16D is an explanatory diagram for explaining the magnetization directions of the free layer and the magnetization fixed layer when a second magnetic field component and a bias magnetic field component are applied on the magnetoresistive effect element according to an embodiment of the present invention.

On the other hand, as shown in FIG. 8B and FIG. 13B, when the first magnetoresistive units R11~R41 and the second magnetoresistive units R12~R42 of the first to fourth magnetic field detection units R1~R4 are connected in parallel, each resistance R of the first to fourth magnetic field detection units R1~R4 can be expressed by the following equation (3) from the resistance $R_1$ (Ω) of the magnetoresistive effect elements 120 included in the first magnetoresistive units R11~R41 and the resistance $R_2$ (Ω) of the magnetoresistive effect elements 120 included in the second magnetoresistive units R12~R43.

$$R = (1/R1 + 1/R2)^{-1} \quad (3)$$

By having the magnetization direction of the magnetization fixed layer 123 of the magnetoresistive effect elements 120 included in the first magnetoresistive units R11~R41 and the magnetization direction of the magnetization fixed layer 123 of the magnetoresistive effect elements 120 included in the second magnetoresistive units R12~R42 be antiparallel to each other, the influence of fluctuations in the magnetization direction of the free layer due to the bias magnetic field Hb in the Y direction on the output from the magnetic sensor device can be totally offset in each of the first to fourth magnetic field detection units R1~R4, and as is clear from the above equation (3), fluctuation of the midpoint potential due to the bias magnetic field Hb in the Y direction can be completely suppressed in theory.

The magnetic sensor according to the present embodiment can be manufactured, for example, as follows.

The manufacturing method of the magnetic sensor 10 includes a step of forming a plurality of the magnetoresistive effect elements 120. The step of forming a plurality of the magnetoresistive effect elements 120 includes a first step of initial magnetoresistive effect elements that include initial magnetization fixed layers; and a second step of forming the magnetoresistive effect elements 120 including the magnetization fixed layers 123 by fixing magnetization directions of the initial magnetization fixed layers in the predetermined direction using a laser beam and a magnetic field for annealing.

In the first step, for example, the initial magnetoresistive effect elements including first to fourth initial magnetoresistive effect elements are formed. The first initial magnetoresistive effect elements correspond to the magnetoresistive effect elements 120 included in the first magnetoresistive unit R11 and the second magnetoresistive unit R12 of the first magnetic field detection unit R1 of the magnetic sensor 10. The second initial magnetoresistive effect elements correspond to the magnetoresistive effect elements 120 included in the first magnetoresistive unit R21 and the second magnetoresistive unit R22 of the second magnetic field detection unit R2 of the magnetic sensor 10. The third initial magnetoresistive effect elements correspond to the magnetoresistive effect elements 120 included in the first magnetoresistive unit R31 and the second magnetoresistive unit R32 of the third magnetic field detection unit R3 of the magnetic sensor 10. The fourth initial magnetoresistive effect elements correspond to the magnetoresistive effect elements 120 included in the first magnetoresistive unit R41 and the second magnetoresistive unit R42 of the fourth magnetic field detection unit R4 of the magnetic sensor 10.

In the second step, for example, while applying the magnetic field for annealing in the first direction (for example, the +Y direction) to all of the initial magnetoresistive elements, the first to fourth initial magnetoresistive effect elements corresponded to the magnetoresistive elements 120 included in the first magnetoresistive units R11 to R41 are irradiated with the laser beam. As the result, the magnetization directions of the initial magnetization fixed layers of the first to fourth magnetoresistive elements irradiated with the laser beam are fixed in the first direction (for example, the +Y direction). Similarly, while applying the magnetic field for annealing in the second direction (for example, -Y direction) to all of the initial magnetoresistive element the first to fourth initial magnetoresistive effect elements corresponded to the magnetoresistive elements 120 included in the second magnetoresistive units R12 to R42 are irradiated with the laser beam. As the result, the magnetization directions of the initial magnetization fixed layers of the first to fourth magnetoresistive elements irradiated with the laser beam are fixed in the second direction (for example, the -Y direction). In this way, it is possible to form the magnetoresistive elements 120 in which the magnetization direction of the magnetization fixed layers 123 are fixed in the predetermined direction.

The method of fixing the magnetization direction of the magnetization fixed layers 123 (the initial magnetization fixed layers) using the laser beam may be so-called laser annealing.

The embodiments described above is described for facilitating the understanding of the present invention and is not described for limiting the present invention. Therefore, each element disclosed in the above embodiment shall be construed to include all design changes and equivalents belonging within the technical scope of the present invention.

In the above embodiment, the lens module was described as an example of an application including a magnetic sensor device, but the present invention is not limited to this embodiment. The magnetic sensor device in the present embodiment can be used in applications for detecting a position change in the XY plane or a position change in the Z direction from a change in the magnetic field in the Z direction, and as applications provided with this magnetic sensor device, examples thereof include actuators used in robot joint mechanisms or the like, open/close detection mechanisms for note computers, joysticks, brushless motors, electronic devices such as magnetic encoders, and the like.

EXAMPLES

Hereinafter, the present invention will be described in more detail with reference to Examples and the like, but the present invention is not limited to the following Examples and the like.

Test Example 1

Figure 17A:
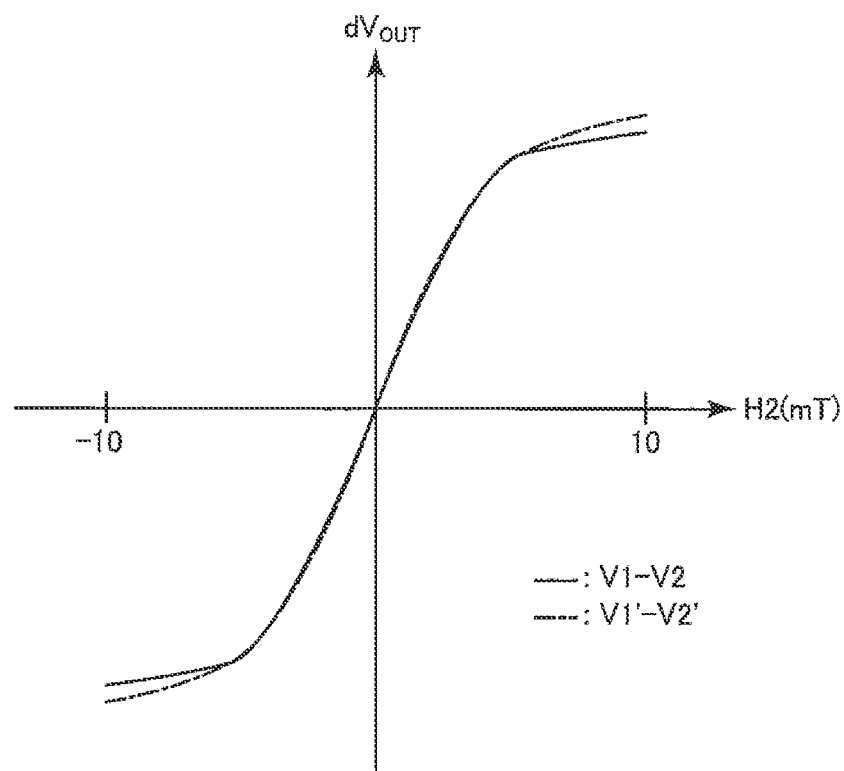
FIG. 17A is a graph showing the differential output found in Test Example 1.
Figure 17B:
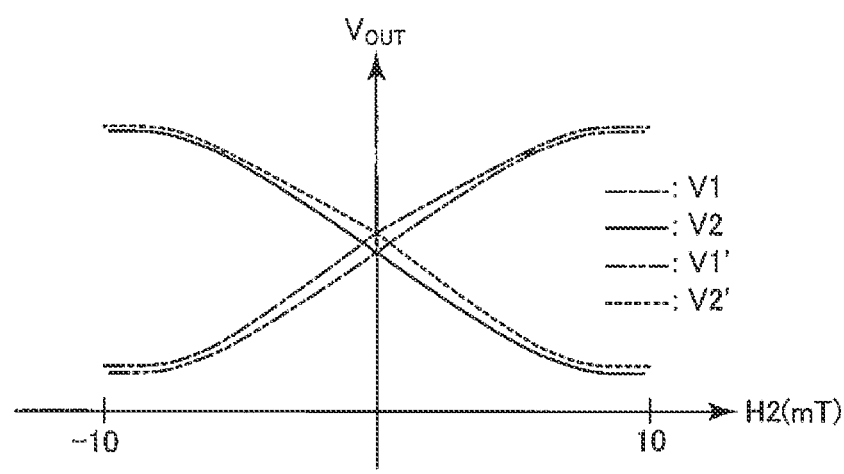
FIG. 17B is a graph showing the output potential found in Test Example 1.

Using the magnetic sensor 10 (Sample 1) having the configurations shown in FIG. 8A, FIG. 9, FIG. 10 and FIG. 13A, the output ($V_{OUT}$, V1) of the first output port E1, the output ($V_{OUT}$, V2) of the second output port E2, and the differential output ($dV_{OUT}$, V1–V2) were found by simulation when the range of the magnetic field strength of the second magnetic field component H2 is −10 mT~10 mT under the condition that a bias magnetic field Hb having a magnetic field strength of 10 mT is applied on the magnetic sensor 10. Similarly, the output E1 ($V_{OUT}$, V1') of the first output port, the output ($V_{OUT}$, V2') of the second output port E2 and the differential output ($DV_{OUT}$, V1'–V2') were also found by simulation under the condition that the bias magnetic field Hb is not applied on the magnetic sensor 10. The results are shown in FIG. 17A and FIG. 17B. The anisotropic magnetic field of the free layer 121 of each magnetoresistive effect element 120 included in the first to fourth magnetic field detection units R1~R4 was set to 25 mT.

Test Example 2

Figure 18A:
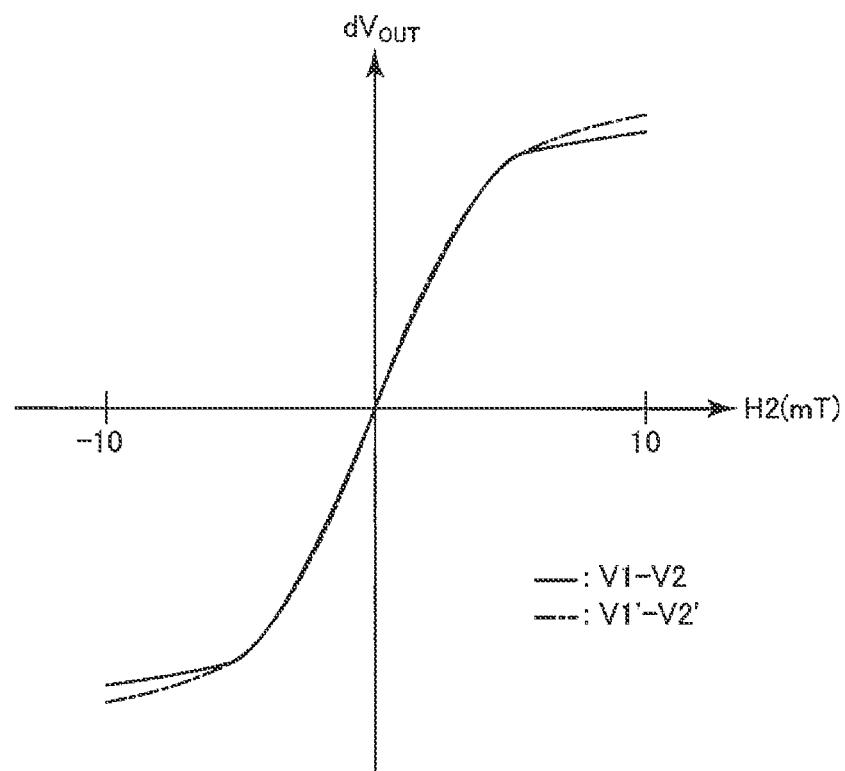
FIG. 18A is a graph showing the differential output found in Test Example 2.
Figure 18B:
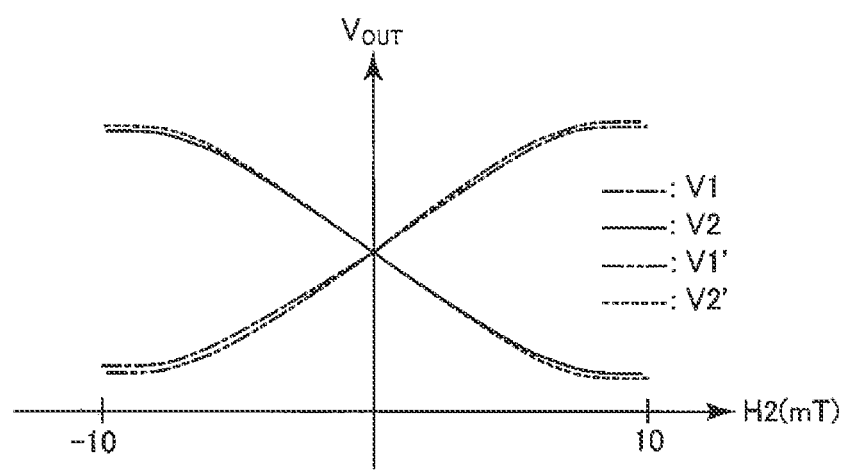
FIG. 18B is a graph showing the output potential found in Test Example 2.

The output ($V_{OUT}$, V1) of the first output port E1, the output ($V_{OUT}$, V2) of the second output port E2 and the differential output ($dV_{OUT}$, V1–V2), along with the output ($V_{OUT}$, V1') of the first output port E1 the output ($V_{OUT}$, V2') of the second output port E2 and the differential output ($dV_{OUT}$, V1'–V2') were found by simulation the same as in Test Example 1 except that the magnetic sensor 10 (Sample 2) having the configurations shown in FIG. 8B, FIG. 9, FIG. 10 and FIG. 13B was used. The results are shown in FIG. 18A and FIG. 18B.

Test Example 3

Figure 19A:
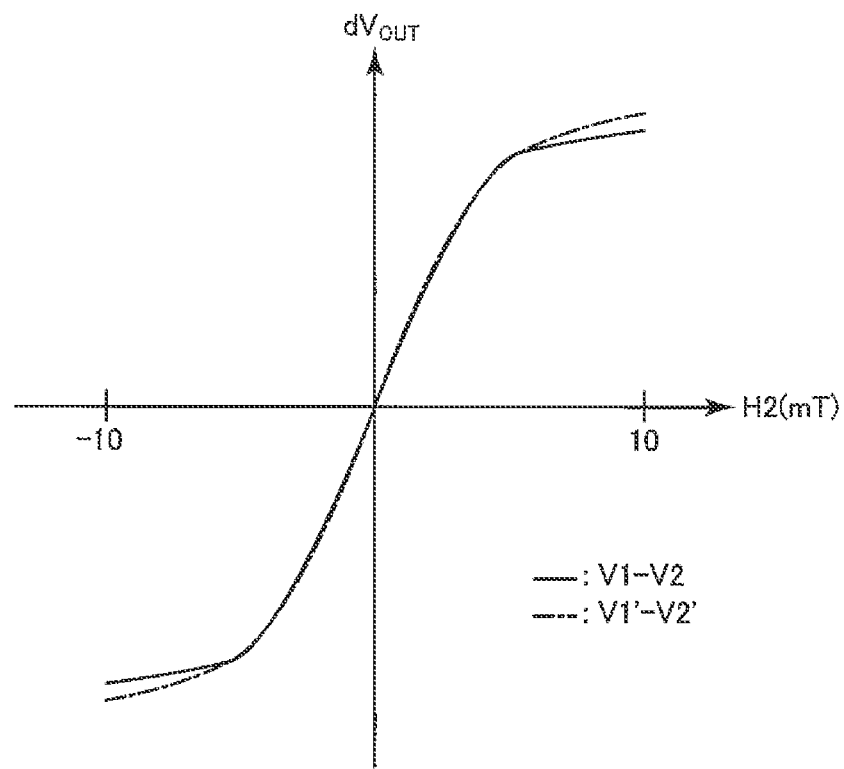
FIG. 19A is a graph showing the differential output found in Test Example 3.
Figure 19B:
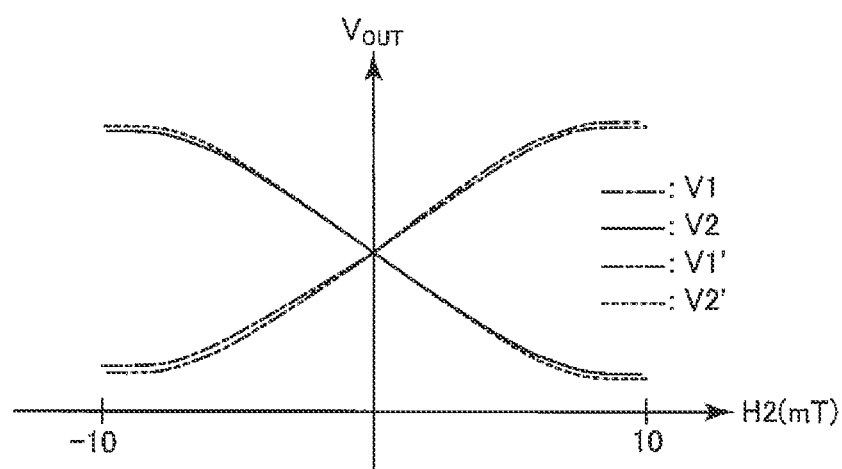
FIG. 19B is a graph showing the output potential found in Test Example 3.

The output ($V_{OUT}$, V1) of the first output port E1, the output ($V_{OUT}$, V2) of the second output port E2 and the differential output ($dV_{OUT}$, V1–V2) along with the output ($V_{OUT}$, V1') of the first output port E1, the output ($V_{OUT}$, V2') of the second output port E2 and the differential output ($dV_{OUT}$, V1'–V2') were found by simulation the same as in Test Example 1 except that the magnetic sensor 10 (Sample 3) having the configurations shown in FIG. 8C, FIG. 9, FIG. 10 and FIG. 13C was used. The results are shown in FIG. 19A and FIG. 19B.

Test Example 4

Figure 20A:
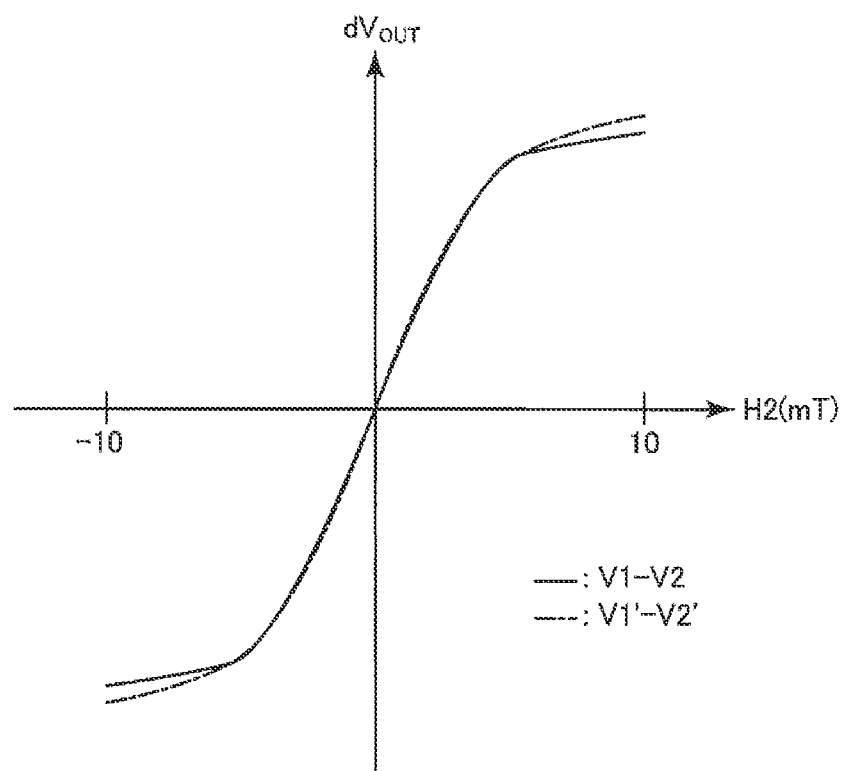
FIG. 20A is a graph showing the differential output found in Test Example 4.
Figure 20B:
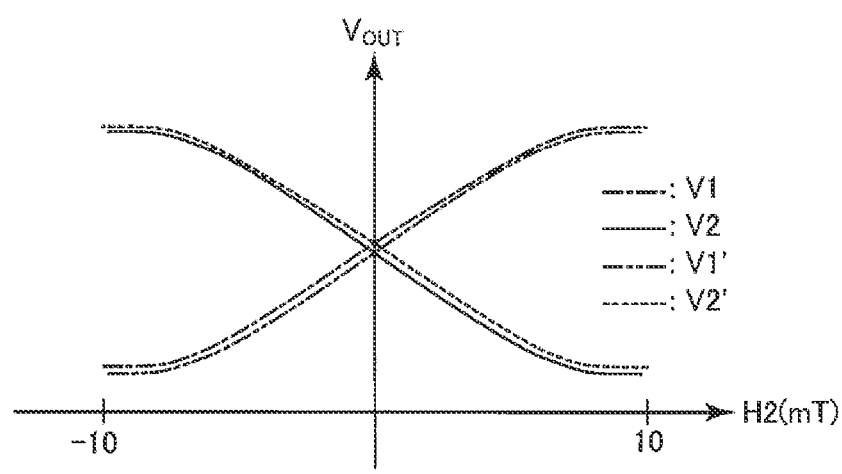
FIG. 20B is a graph showing the output potential found in Test Example 4.

The output ($V_{OUT}$, V1) of the first output port E1, the output ($V_{OUT}$, V2) of the second output port E2 and the differential output ($dV_{OUT}$, V1-V2) along with the output ($V_{OUT}$, V1') of the first output port E1, the output ($V_{OUT}$, V2') of the second output port E2 and the differential output ($dV_{OUT}$, V'-V2') were found by simulation the same as in Test Example 1 except that the magnetic sensor 10 (Sample 4) having the configurations shown in FIG. 8D, FIG. 9, FIG. 10 and FIG. 13D was used. The results are shown in FIG. 20A and FIG. 20B.

The value of the differential output ($dV_{OUT}$) on the vertical axis in the graphs shown in FIGS. 17A, FIG. 18A, FIG. 19A and FIG. 20A, and the value of the output ($V_{OUT}$) on the vertical axis in the graphs shown in FIG. 17B, FIG. 18B, FIG. 19B and FIG. 20B are all normalized values.

From the results shown in FIG. 17A, FIG. 18A, FIG. 19A, and FIG. 20A, it was confirmed that in the magnetic sensors 10 of Samples 1~4, the sensitivity is less likely to fluctuate, and offset is less likely to occur even when a bias magnetic field Hb is applied.

Furthermore, as is clear from the results shown in FIG. 17B, FIG. 18B, FIG. 19B and FIG. 20B, in the magnetic sensors 10 of Samples 1~4, the fluctuation amount of the midpoint potential (mV) when the bias magnetic field Hb is applied is about 2% or less of the midpoint potential (mV) when the bias magnetic field Hb is not applied, and it was confirmed that the midpoint potential is unlikely to fluctuate. In particular, in the magnetic sensor 10 (Sample 2) in which the first magnetoresistive units R11~R41 and the second magnetoresistive units R12~R42 are connected in parallel in all of the first to fourth magnetic field detection units R1~R4 and in the magnetic sensor 10 (Sample 3) in which the first magnetoresistive units R21 and R41 and the second magnetoresistive units R22 and R42 are connected in parallel in the second magnetic field detection unit R2 and the fourth magnetic field detection unit R4, it was confirmed that the effect of suppressing midpoint potential fluctuation was extremely excellent.

Test Example 5

Figure 21A:
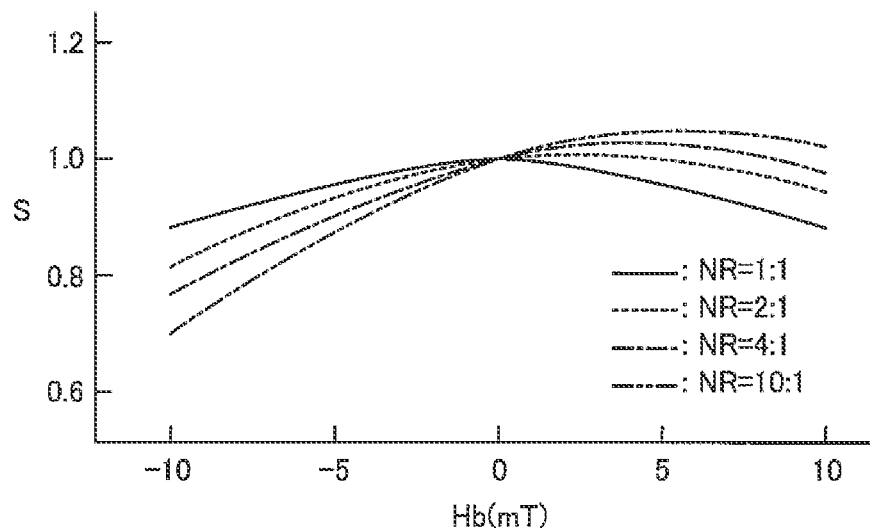
FIG. 21A is a graph showing the sensitivity of the magnetic sensor of Sample 1 found in Test Example 5.
Figure 21B:
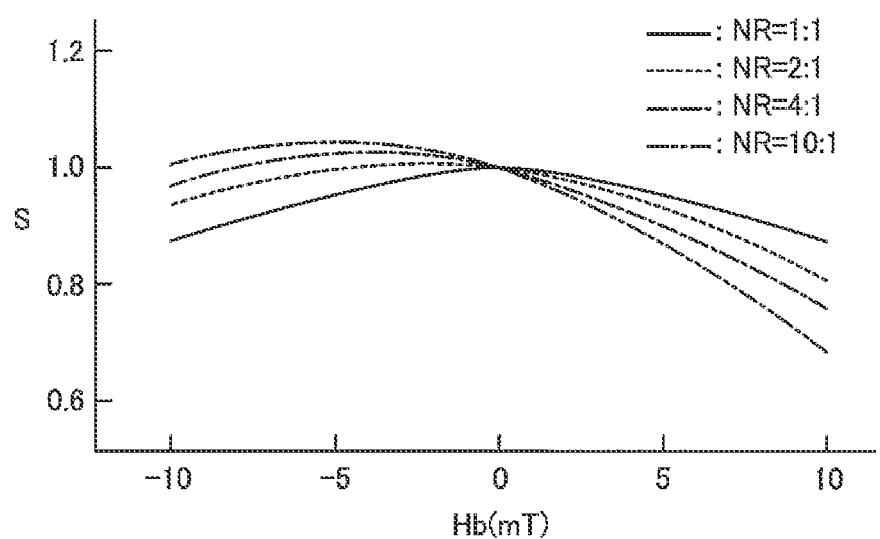
FIG. 21B is a graph showing the sensitivity of the magnetic sensor of Sample 2 found in Test Example 5.

In the above-described Sample 1 and Sample 2, the output (V1) of the first output port E1, the output (V2) of the second output port E2 and the differential output (V1-V2) were found by simulation the same as in Test Example 1, with the ratio (numerical ratio NR) of the number of magnetoresistive effect elements 120 included in the first magnetoresistive units R11~R41 to the number of magnetoresistive effect elements 120 included in the second magnetoresistive units R12~R42 in the first to fourth magnetic field detection units R1~R4, respectively, being 1:1, 2:1, 4:1 and 10:1, and the range of magnetic field strengths of the bias magnetic field Hb being −10 mT to 10 mT, and the sensitivity (S) of the magnetic sensor device was found. The results are shown in FIG. 21A and FIG. 21B. In FIG. 21A and FIG. 21B, the value of the sensitivity (S) of the magnetic sensor device is a value normalized with the sensitivity being "1" when the magnetic field strength of the bias magnetic field Hb is 0 mT.

As shown in FIGS. 21A and 21B, in Sample 1, by having the number of magnetoresistive effect elements 120 included in the first magnetoresistive units R11~R41 and the number of magnetoresistive effect elements 120 included in the second magnetoresistive units R12~R42 differ, and by having the bias magnetic field Hb applied on the magnetic sensor 10 always be in one direction (for example, the +Y direction), it was confirmed that it is possible to further suppress fluctuations in the sensitivity of the magnetic sensor device. Therefore, by incorporating the magnetic sensor device so that the bias magnetic field Hb in one direction is always applied, it is possible to obtain a magnetic sensor device having an extremely excellent effect of suppressing sensitivity fluctuations due to the bias magnetic field Hb. On the other hand, when the number of magnetoresistive effect elements 120 included in the first magnetoresistive unit R11~R41 and the number of magnetoresistive effect elements 120 included in the second magnetoresistive units R12~R42 are the same, the trajectory of the sensitivity fluctuation does not change regardless of whether the direction of the bias magnetic field Hb applied on the sensor 10 is one direction (for example, the +Y direction) or the other direction (for example, the −Y direction). Consequently, in an electronic device or the like, a bidirectional (for example, +Y direction and −Y direction) bias magnetic field Hb may be applied on the magnetic sensor 10 depending on the position where the magnetic sensor device is incorporated, but even in such cases, the sensitivity of the sensor device can be stabilized.

DESCRIPTION OF SYMBOLS

10 Magnetic sensor
11 Magnetic field conversion unit
111 Yoke
12 Magnetic field detection unit
120 Magnetoresistive effect element
13 Magnetic shield
131 First magnetic shield
132 Second magnetic shield

The invention claimed is:
1. A magnetic sensor comprising:
a magnetic field conversion unit that receives an input magnetic field input along a first direction and outputs an output magnetic field along a second direction orthogonal to the first direction;
a magnetic field detection unit provided at a position at which the output magnetic field can be applied; and
a magnetic shield that shields external magnetic fields along the second direction;
wherein the magnetic field conversion unit has a shape in which the length in a third direction orthogonal to both the first direction and the second direction is longer than the length in the second direction, when viewed along the first direction;
the magnetic shield is provided at a position overlapping the magnetic field conversion unit and the magnetic field detection unit, when viewed along the first direction;
the magnetic field detection unit comprises a Wheatstone bridge circuit in which a first bridge circuit, which includes a first magnetic field detection unit and a second magnetic field detection unit, and a second bridge circuit, which includes a third magnetic field detection unit and a fourth magnetic field detection unit, are connected in parallel;
the first through fourth magnetic field detection units each include a first magnetoresistive unit and a second magnetoresistive unit;
the first magnetoresistive unit and the second magnetoresistive unit included in each of the first through fourth magnetic field detection units have magnetoresistive effect elements that include magnetization fixed layers, the magnetization directions of which differ from each other;

the first magnetoresistive unit and the second magnetoresistive unit included in each of the first through fourth magnetic field detection units each include a plurality of the magnetoresistive effect elements; and the number of magnetoresistive effect elements included in the first magnetoresistive unit is larger than the number of magnetoresistive effect elements included in the second magnetoresistive unit.

2. The magnetic sensor according to claim 1, wherein the first magnetoresistive unit and the second magnetoresistive unit included in each of the first through fourth magnetic field detection units are connected in parallel.

3. The magnetic sensor according to claim 1, wherein the first magnetoresistive unit and the second magnetoresistive unit included in each of the first through fourth magnetic field detection units are connected in series.

4. The magnetic sensor according to claim 1, wherein the Wheatstone bridge circuit includes a power supply port, a ground port, a first output port and a second output port;

the first magnetic field detection unit is provided between the power supply port and the first output port;

the second magnetic field detection unit is provided between the first output port and the ground port;

the third magnetic field detection unit is provided between the power supply port and the second output port;

the fourth magnetic field detection unit is provided between the second output port and the ground port; and the first magnetoresistive unit and the second magnetoresistive unit included in two magnetic field detection units of the first magnetic detection unit, the second magnetic field detection unit, the third magnetic field detection unit and the fourth magnetic field detection unit are connected in parallel, and the first magnetoresistive unit and the second magnetoresistive unit included in the other two magnetic field detection units are connected in series.

5. The magnetic sensor according to claim 1, wherein the ratio of the number of magnetoresistive effect elements included in the first magnetoresistive unit to the number of magnetoresistive effect elements included in the second magnetoresistive unit is 2:1~4:1.

6. The magnetic sensor according to claim 1, wherein the magnetization direction of the magnetization fixed layer of the magnetoresistive effect elements included in the first magnetoresistive unit and the magnetization direction of the magnetization fixed layer of the magnetoresistive effect elements included in the second magnetoresistive unit are antiparallel to each other and are a direction along the second direction.

7. The magnetic sensor according to claim 1, wherein the magnetic shield has a shape in which the maximum length in the third direction is longer than the maximum length in the second direction, when viewed along the first direction.

8. The magnetic sensor according to claim 1, wherein a plurality of the magnetic conversion units is in parallel along the second direction.

9. The magnetic sensor according to claim 1, wherein the magnetic shield includes a first magnetic shield and a second magnetic shield; and the magnetic field conversion unit and the magnetic field detection unit are provided between the first magnetic shield and the second magnetic shield in the first direction.

10. The magnetic sensor according to claim 1, wherein the magnetic shield is positioned to one side or the other side of the magnetic field conversion unit and the magnetic field detection unit along the first direction.

11. The magnetic sensor according to claim 1, wherein the first magnetoresistive unit and the second magnetoresistive unit included in each of the first through fourth magnetic field detection units are provided at a position of linear symmetry centered on the axis along the longitudinal direction of the magnetic field conversion unit, wherein the axis passes through the center of the magnetic field conversion unit in the lateral direction when viewed along the first direction.

12. The magnetic sensor according to claim 1, wherein the magnetoresistive effect elements are TMR elements or GMR elements.

13. A position detection apparatus comprising:
magnetic sensor according to claim 1;
a magnetic field generation unit that generates the input magnetic field; and
a substrate on which the magnetic sensor is provided;
wherein the magnetic field generation unit is supported on the substrate to be movable along at least one direction of the first direction and the third direction relative to the substrate.

14. An electronic device comprising the position detection apparatus according to claim 13.

15. A method of manufacturing the magnetic sensor according to claim 1 comprising:
a step for forming the magnetoresistive effect elements;
wherein the step for forming the magnetoresistive effect elements includes:
a step for initial magnetoresistive effect elements that include initial magnetization fixed layers; and
a step for forming the magnetization fixed layers by fixing magnetization directions of the initial magnetization fixed layers using a laser beam and a magnetic field.

16. A magnetic sensor comprising:
a magnetic field conversion unit that receives an input magnetic field input along a first axis and outputs an output magnetic field along a second axis orthogonal to the first axis;
a magnetic field detection unit provided at a position at which the output magnetic field can be applied; and
a magnetic shield that shields external magnetic fields along the second axis;
wherein the output magnetic field output from the magnetic field conversion unit includes a first magnetic field component output in a first direction along the second axis and a second magnetic field component output in a second direction along the second axis, wherein the first direction and the second direction are opposite to each other,
the magnetic field conversion unit has a shape in which the length in a third axis orthogonal to both the first axis and the second axis is longer than the length in the second axis, when viewed along the first axis;
the magnetic shield is provided at a position overlapping the magnetic field conversion unit and the magnetic field detection unit, when viewed along the first axis;
the magnetic field detection unit comprises a Wheatstone bridge circuit in which a first bridge circuit, which includes a first magnetic field detection unit and a second magnetic field detection unit, and a second bridge circuit, which includes a third magnetic field detection unit and a fourth magnetic field detection unit, are connected in parallel;

the first through fourth magnetic field detection units each include a first magnetoresistive unit and a second magnetoresistive unit;

when viewed along the first axis, the first magnetoresistive unit is positioned at a place at which one of the first magnetic field component and the second magnetic field component can be applied and the second magnetoresistive unit is positioned at a place at which the other of the first magnetic field component and the second magnetic field component can be applied;

the first magnetoresistive unit and the second magnetoresistive unit included in each of the first through fourth magnetic field detection units have magnetoresistive effect elements that include magnetization fixed layers, the magnetization directions of which differ from each other; and the magnetization direction of the magnetization fixed layer of the magnetoresistive effect elements included in the first magnetoresistive unit and the magnetization direction of the magnetization fixed layer of the magnetoresistive effect elements included in the second magnetoresistive unit are antiparallel to each other and are a direction along the second axis.

17. A method of manufacturing the magnetic sensor according to claim 16 comprising:

a step for forming the magnetoresistive effect elements;

wherein the step for forming the magnetoresistive effect elements includes:

a step for initial magnetoresistive effect elements that include initial magnetization fixed layers; and a step for forming the magnetization fixed layers by fixing magnetization directions of the initial magnetization fixed layers using a laser beam and a magnetic field.

* * * * *